(12) United States Patent
Hirakawa

(10) Patent No.: US 8,997,821 B2
(45) Date of Patent: Apr. 7, 2015

(54) DELAMINATION SYSTEM

(71) Applicant: Tokyo Electron Limited, Tokyo (JP)

(72) Inventor: Osamu Hirakawa, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/975,584

(22) Filed: Aug. 26, 2013

(65) Prior Publication Data

US 2014/0069588 A1 Mar. 13, 2014

(30) Foreign Application Priority Data

Sep. 7, 2012 (JP) .................................. 2012-197212

(51) Int. Cl.
*B32B 38/10* (2006.01)
*B32B 43/00* (2006.01)
*H01L 21/67* (2006.01)

(52) U.S. Cl.
CPC ............ *B32B 43/006* (2013.01); *B32B 2457/14* (2013.01); *H01L 21/67092* (2013.01); *Y10S 156/93* (2013.01); *Y10S 156/941* (2013.01); *Y10S 156/942* (2013.01)

(58) Field of Classification Search
USPC ................... 156/701, 703, 750, 930, 941, 942
See application file for complete search history.

(56) References Cited

U.S. PATENT DOCUMENTS

| 8,366,873 | B2* | 2/2013 | George ........................ 156/707 |
| 2003/0116275 | A1* | 6/2003 | Yanagita et al. .............. 156/344 |
| 2005/0236114 | A1* | 10/2005 | Yanagita et al. .............. 156/584 |
| 2009/0139662 | A1* | 6/2009 | Nakamura et al. ........... 156/584 |
| 2011/0253315 | A1* | 10/2011 | George ........................ 156/718 |

FOREIGN PATENT DOCUMENTS

JP        2012-69914 A        4/2012

* cited by examiner

*Primary Examiner* — Philip Tucker
*Assistant Examiner* — Nickolas Harm
(74) *Attorney, Agent, or Firm* — Nath, Goldberg & Meyer; Jerald L. Meyer

(57) ABSTRACT

A delamination system delaminates a laminated substrate, in which a first substrate and a second substrate are bonded together, into the first substrate and the second substrate. The delamination system has a first processing block processing the laminated substrate or the delaminated first substrate and a second processing block processing the delaminated second substrate. The first processing block has a delamination station having a delamination device that delaminates the laminated substrate transferred by a first transfer device into the first substrate and the second substrate. The second processing block has a second cleaning station and a delivery station. The second cleaning station has a second cleaning device cleaning the delaminated second substrate. The delivery station is disposed between the second cleaning station and the delamination station. The delivery station receives the delaminated second substrate from the delamination station and delivers it to the second cleaning station.

4 Claims, 31 Drawing Sheets

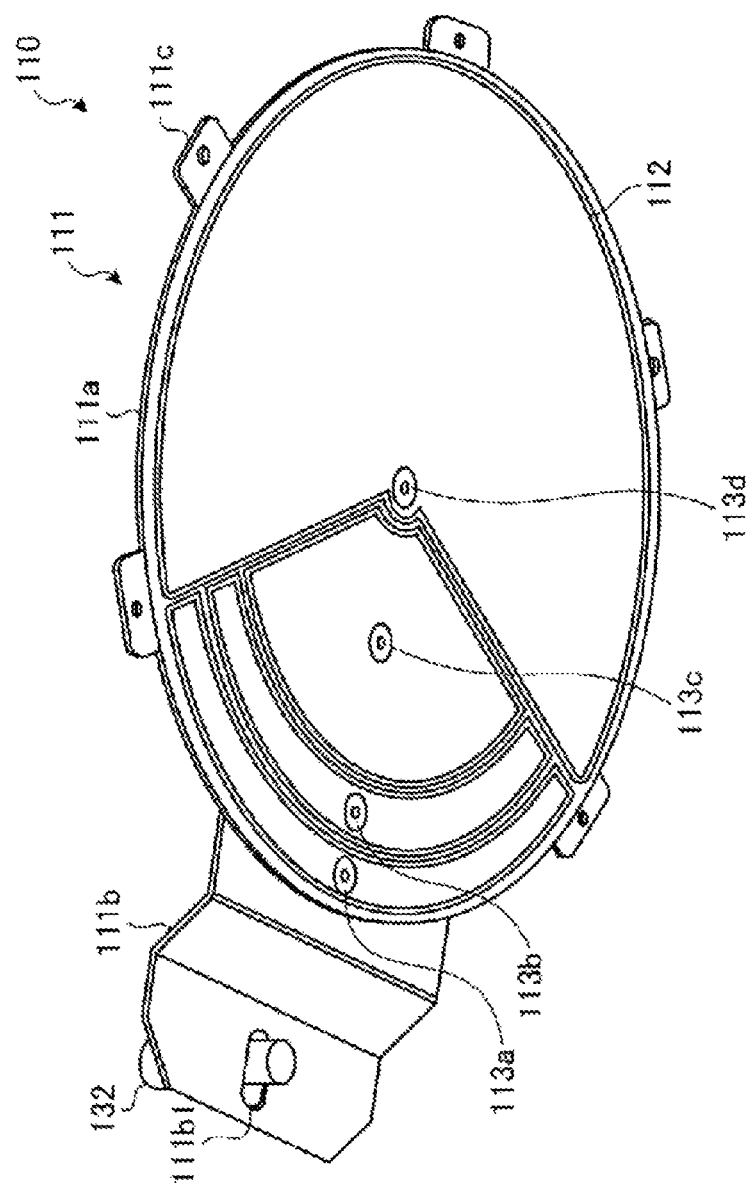

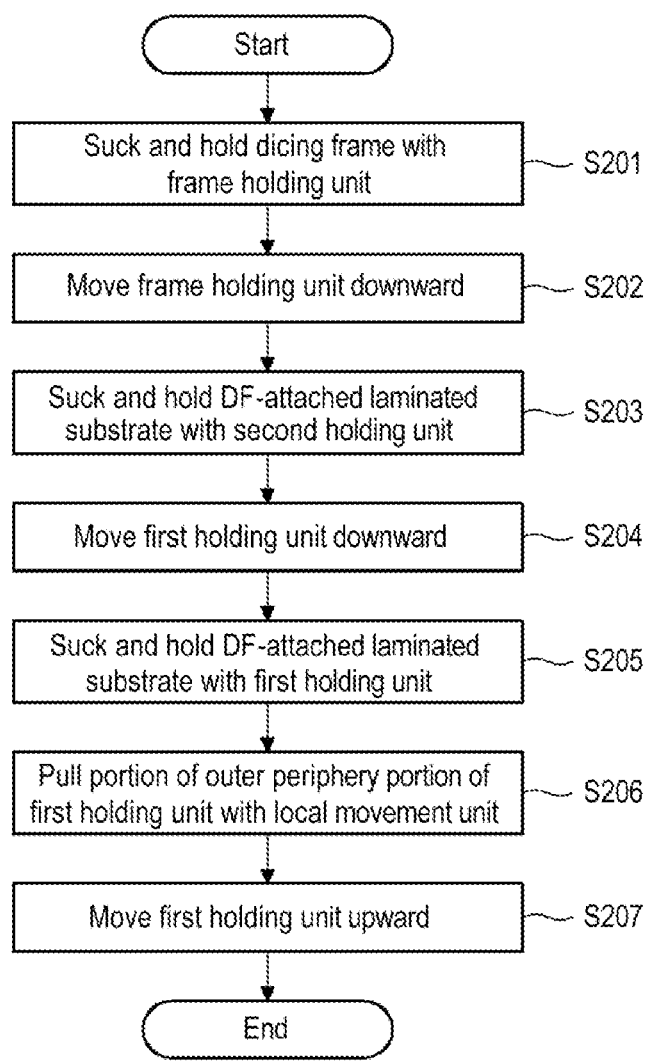

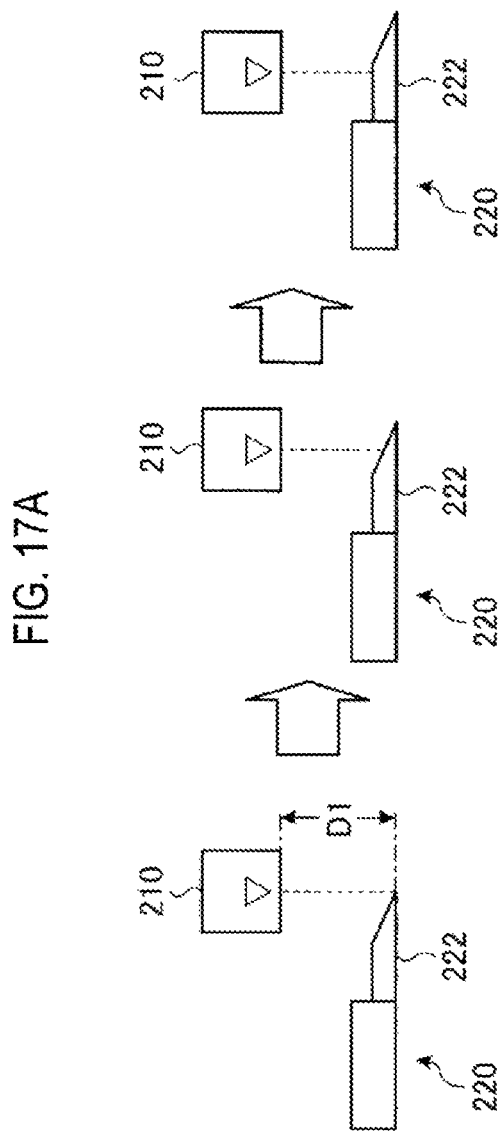

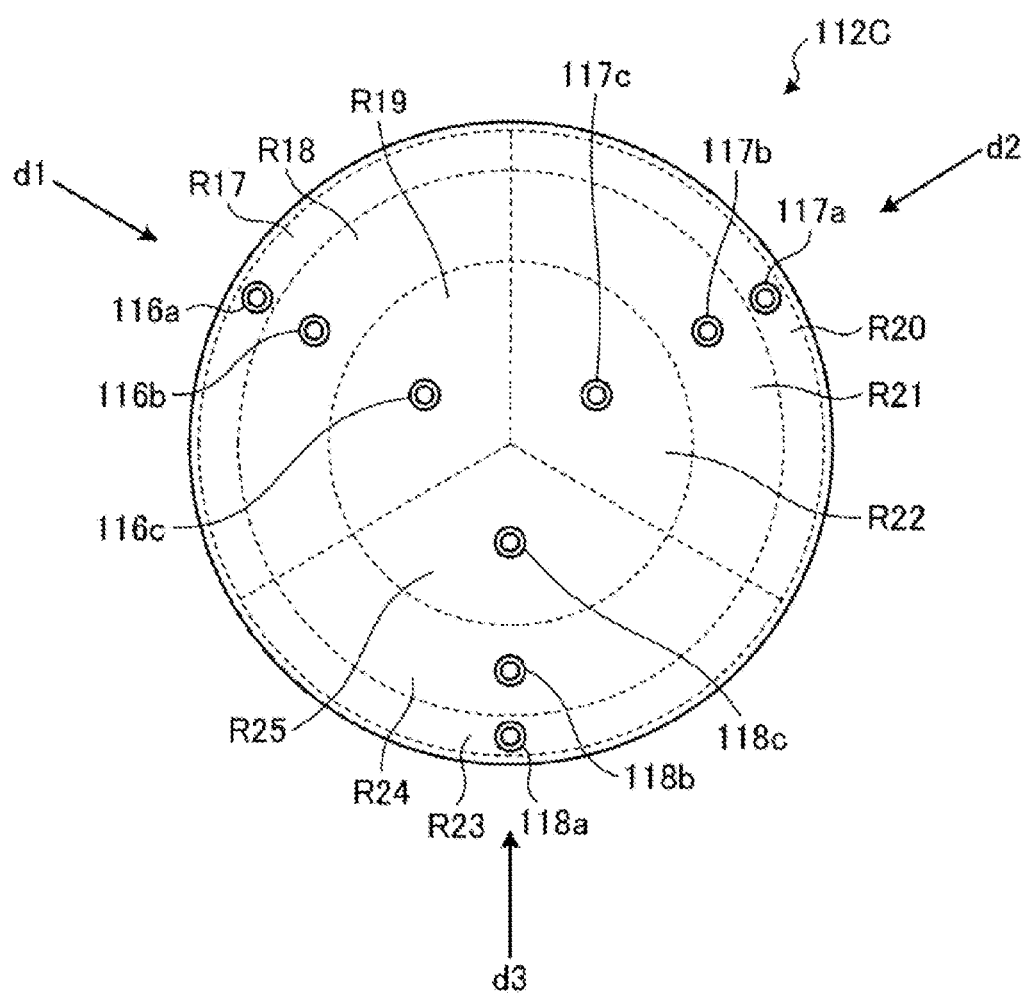

DELAMINATION SYSTEM

CROSS-REFERENCE TO RELATED APPLICATION

This application claims the benefit of Japanese Patent Application No. 2012-197212, filed on Sep. 7, 2012, in the Japan Patent Office, the disclosure of which is incorporated herein in its entirety by reference.

TECHNICAL FIELD

The present disclosure relates to a delamination system for delaminating a laminated substrate.

BACKGROUND

In recent years, in a semiconductor device manufacturing process, semiconductor substrates such as a silicon wafer, a compound semiconductor wafer and the like become larger in diameter and thinner in thickness. A semiconductor substrate having a large diameter and a thin thickness may have a warp or a crack during a transfer operation or a grinding process. Thus, in the semiconductor device manufacturing process, the semiconductor substrate is reinforced by bonding a support substrate to the semiconductor substrate. Then, the reinforced semiconductor substrate is transferred or subjected to a grinding process and thereafter the support substrate is delaminated from the reinforced semiconductor substrate.

By way of example, a first holding unit may hold the semiconductor substrate while a second holding unit may hold the support substrate. The support substrate may be delaminated from the reinforced semiconductor substrate by vertically moving an outer peripheral portion of the second holding unit.

The delamination process for the semiconductor substrate and the support substrate may be finished after the semiconductor substrate and the support substrate are delaminated in the aforementioned manner and bonding surfaces of the semiconductor substrate and the support substrate are cleaned. However, the aforesaid delamination process does not consider the efficiency of the delamination processes.

SUMMARY

Various embodiments of the present disclosure provide a delamination system capable of achieving the improvement in throughput.

According to one embodiment of the present disclosure, there is provided a delamination system for delaminating a laminated substrate, in which a first substrate and a second substrate are bonded together, into the first substrate and the second substrate. The laminated substrate is disposed in an opening of a frame, which has a diameter larger than the laminated substrate. Further, the laminated substrate is held by the frame with a non-bonding surface of the first substrate attached to a tape provided in the opening. The delamination system includes a first processing block configured to process the laminated substrate or the delaminated first substrate, and a second processing block configured to process the delaminated second substrate. The first processing block includes a carry-in/carry-out station in which the laminated substrate held by the frame or the delaminated first substrate is placed, a first transfer device configured to transfer the delaminated first substrate or the laminated substrate placed in the carry-in/carry-out station, a delamination station including a delamination device configured to delaminate the laminated substrate transferred by the first transfer device into the first substrate and the second substrate, and a first cleaning station including a first cleaning device configured to clean the delaminated first substrate transferred by the first transfer device in a state where the delaminated first substrate is held by the frame. The second processing block includes a second cleaning station including a second cleaning device configured to clean the delaminated second substrate, a delivery station disposed between the second cleaning station and the delamination station and configured to receive the delaminated second substrate from the delamination station and to deliver the delaminated second substrate to the second cleaning station, a second transfer device configured to transfer the second substrate cleaned by the second cleaning device, and a carry-out station in which the second substrate transferred by the second transfer device is placed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7A is a schematic perspective view showing the configuration of a first holding unit.

FIG. 9 is a flowchart showing process procedures of a delamination process.

FIG. 17A is a view illustrating an operation of the delamination device.

FIG. 18C is a schematic top view showing a still another configuration of the suction pad.

DETAILED DESCRIPTION

Figure 1:
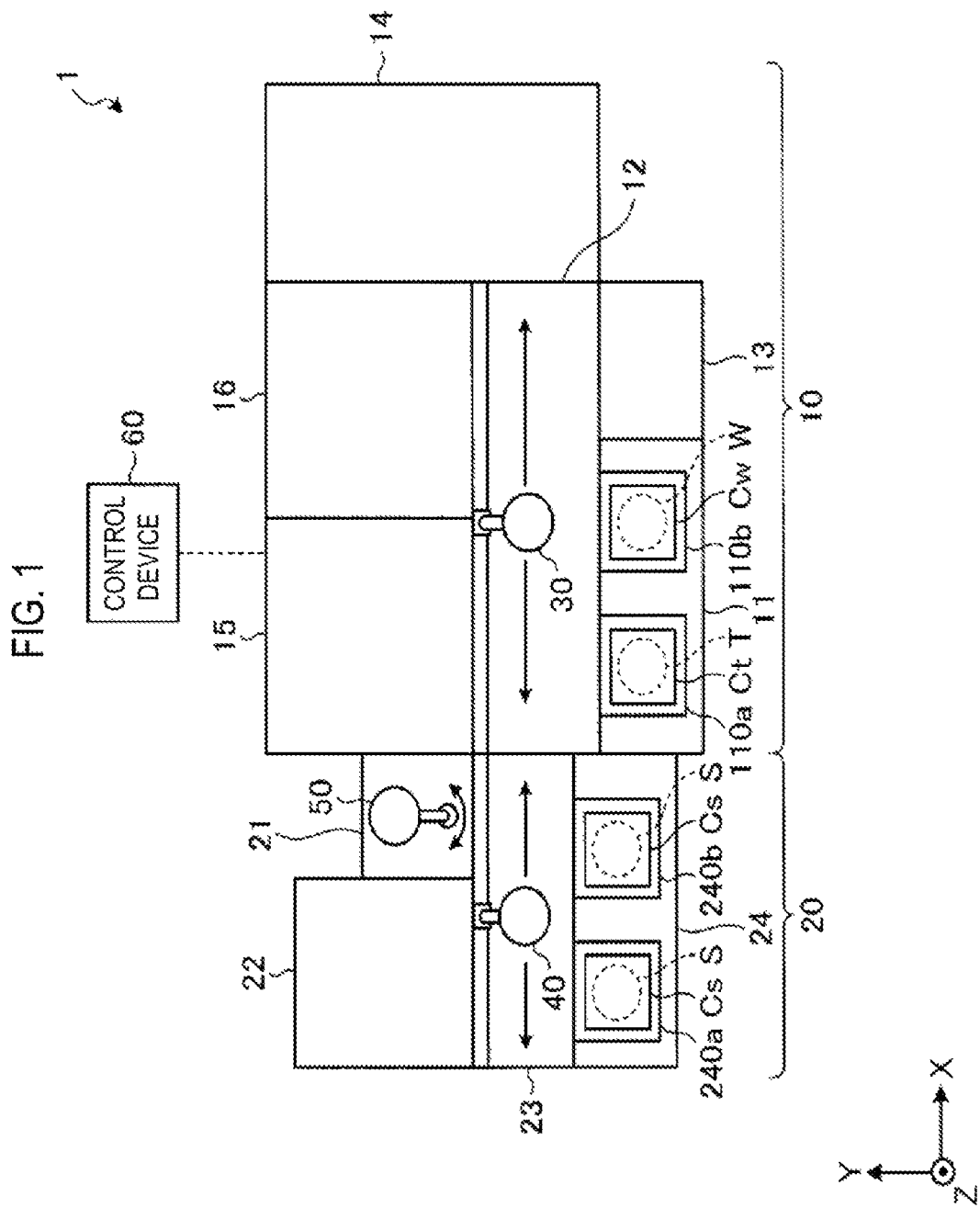
FIG. 1 is a schematic plan view showing the configuration of a delamination system according to a first embodiment.
Figure 2:
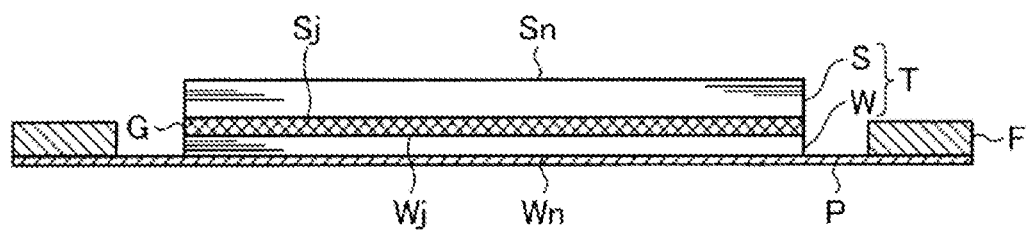
FIG. 2 is a schematic side view of a laminated substrate held by a dicing frame.
Figure 3:
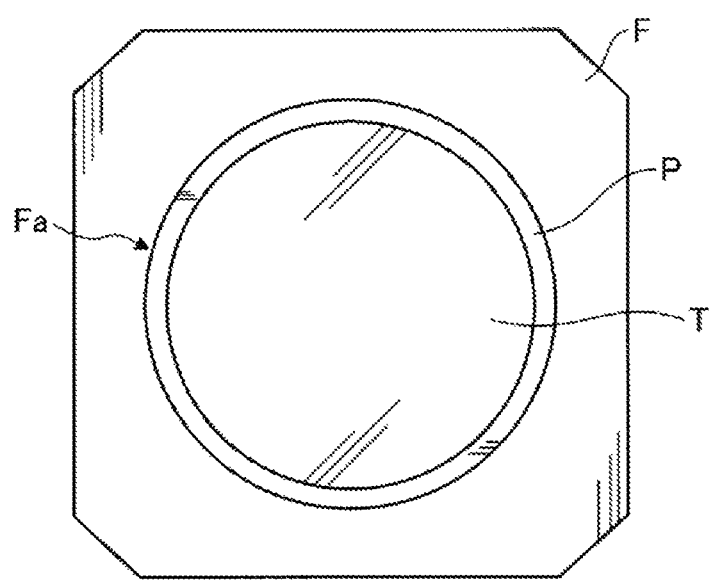
FIG. 3 is a schematic top view of a laminated substrate held by a dicing frame.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments First Embodiment 1. Delamination System The configuration of a delamination system according to a first embodiment will be described with reference to FIGS. 1 to 3. FIG. 1 is a schematic plane view showing the configuration of the delamination system according to the first embodiment. FIGS. 2 and 3 are a schematic side view and a schematic top view showing a laminated substrate held by a dicing frame respectively. For the clarification of a positional relationship, an X-axis direction, a Y-axis direction and a Z-axis direction, which are orthogonal to one another, are defined in the following description and a positive Z-axis direction is defined as a vertical upward direction.

The delamination system 1 of the first embodiment shown in FIG. 1 delaminates a laminated substrate T (see FIG. 2), in which a target substrate W and a support substrate S are bonded together by a bonding agent G, into the target substrate W and the support substrate S.

In the following description, as shown in FIG. 2, the surface of the target substrate W, which is bonded to the support substrate S by the bonding agent G, will be referred to as "a bonding surface Wj", while the surface opposite to the bonding surface Wj will be referred to as "a non-bonding surface Wn." Further, the surface of the support substrate S, which is bonded to the target substrate W by the bonding agent G, will be referred to as "a bonding surface Sj", while the surface opposite to the bonding surface Sj will be referred to as "a non-bonding surface Sn."

The target substrate W is a substrate made by forming a plurality of electronic circuits on a semiconductor substrate, e.g., a silicon wafer or a compound semiconductor wafer. The surface of the target substrate W, on which the electronic circuits are formed, is the bonding surface Wj. Further, the target substrate W is thin in thickness by, for example, grinding the non-bonding surface Wn. Specifically, the thickness of the target substrate W is from about 20 μm to about 100 μm.

The support substrate S supports the target substrate W and has a diameter approximately equal to a diameter of the target substrate W. The thickness of the support substrate S is from about 650 μm to about 750 μm. A silicon wafer, a glass substrate, or the like may be used as the support substrate S. The thickness of the bonding agent G for bonding the target substrate W and the support substrate S is from about 40 μm to about 150 μm.

As described above, since the target substrate W is very thin and thus is easily breakable, the target substrate W is reliably protected by a dicing frame F. As shown in FIG. 3, the dicing frame F is a substantially rectangular member having a central opening Fa larger in diameter than the laminated substrate T. The dicing frame F is made of metal such as stainless steel. A dicing tape P is attached to the dicing frame F such that it closes the opening Fa from a back surface of the dicing frame F, whereby the dicing frame F and the laminated substrate T are bonded together.

Specifically, the laminated substrate T is positioned in the opening Fa of the dicing frame F and the dicing tape P is attached to the non-bonding surface Wn of the target substrate W and the dicing frame F. Thus, the laminated substrate T is held by the dicing frame F. The laminated substrate T is held by the dicing frame F in such a state that the target substrate W is positioned downward while the support substrate S is positioned upward (see FIG. 2).

Referring to FIG. 1, the delamination system 1 according to the first embodiment includes a first processing block 10 and a second processing block 20. The first processing block 10 and the second processing block 20 are disposed side by side along the X-axis direction in the order of the second processing block 20 and the first processing block 10.

The first processing block 10 is configured to perform the processes for the substrate held by the dicing frame F (specifically, the laminated substrate T or the delaminated target substrate W). The first processing block 10 includes a carry-in/carry-out station 11, a first transfer region 12, a standby station 13, an edge cut station 14, a delamination station 15 and a first cleaning station 16.

The second processing block 20 is configured to perform the processes for the substrate not held by the dicing frame F (specifically, the delaminated support substrate S). The second processing block 20 includes a delivery station 21, a second cleaning station 22, a second transfer region 23 and a carry-out station 24.

The first transfer region 12 of the first processing block 10 and the second transfer region 23 of the second processing block 20 are disposed side by side along the X-axis direction. At a side of the first transfer region 12 in the negative Y-axis direction, the carry-in/carry-out station 11 and the standby station 13 are disposed side by side along the X-axis direction in the order of the carry-in/carry-out station 11 and the standby station 13. The carry-out station 24 is disposed at the side of the second transfer region 23 in the negative Y-axis direction.

The delamination station 15 and the first cleaning station 16 are disposed side by side along the X-axis direction in the order of the delamination station 15 and the first cleaning station 16 as they are located opposite to the carry-in/carry-out station 11 and the standby station 13 with the first transfer region 12 therebetween. The delivery station 21 and the second cleaning station 22 are disposed side by side along the X-axis direction in the order of the second cleaning station 22 and the delivery station 21 as they are located opposite to the carry-out station 24 with the second transfer region 23 therebetween. The edge cut station 14 is disposed at a side of the first transfer region 12 in the positive X-axis direction.

The description will be first made for the configuration of the first processing block 10. In the carry-in/carry-out station 11, a cassette Ct configured to receive the laminated substrate T held by the dicing frame F (hereinafter referred to as "DF-attached laminated substrate T") and a cassette Cw configured to receive the delaminated target substrate W are carried in from the outside or carried out to the outside. A cassette placing table is provided in the carry-in/carry-out station 11. A plurality of cassette placing plates 110a and 110b on which the cassettes Ct and Cw are placed are provided on the cassette placing table.

The DF-attached laminated substrate T or the delaminated target substrate W is transferred in the first transfer region 12. A first transfer device 30 transferring the DF-attached laminated substrate T or the delaminated target substrate W is provided in the first transfer region 12.

The first transfer device 30 is a substrate transfer device that includes a transfer arm unit and a substrate holding unit provided at a tip end of the transfer arm unit. The transfer arm unit is capable of movement in a horizontal direction, up-and-down movement in a vertical direction and rotation around the vertical direction. The first transfer device 30 holds a substrate using the substrate holding unit and transfers the substrate held by the substrate holding unit to a desired place using the transfer arm unit.

Further, the substrate holding unit of the first transfer device 30 holds the dicing frame F by sucking or gripping the dicing frame F. Thus, the substrate holding unit substantially horizontally holds the DF-attached laminated substrate T or the delaminated target substrate W.

An ID reading device reading out an ID (identification) of the dicing frame F is disposed in the standby station 13. The DF-attached laminated substrate T under processing can be identified by the ID reading device.

In addition to the aforementioned ID reading process, where necessary, a standby process of temporarily keeping the DF-attached laminated substrate T in a standby state is performed a temporary standby unit in the standby station 13. A placing table, on which the DF-attached laminated substrate T transferred by the first transfer device 30 is placed, is provided in the standby station 13. The ID reading device and the temporary standby unit are placed on the placing table.

An edge cut process removes a peripheral edge of the bonding agent G (see FIG. 2) by dissolving it with a solvent. The edge cut process is performed in the edge cut station 14. Since the peripheral edge of the bonding agent G is removed through the edge cut process, the target substrate W and the support substrate S can be easily delaminated in a delamination process which will described below. In the edge cut station 14 is provided an edge cut device, which is configured to dissolve the peripheral edge of the bonding agent G with a solvent by immersing the laminated substrate T into the solvent for the bonding agent G.

A delamination process of delaminating the DF-attached laminated substrate T transferred by the first transfer device 30 into the target substrate W and the support substrate S is performed in the delamination station 15. A delamination device configured to perform the delamination process is provided in the delamination station 15. The detailed configuration and operation of the delamination device will be described below.

A cleaning process of cleaning the delaminated target substrate W is performed in the first cleaning station 16. A first cleaning device, which is configured to clean the delaminated target substrate W as it is held by the dicing frame F, is provided in the first cleaning station 16. The detailed configuration of the first cleaning device will be described below.

In the above-described first processing block 10, the ID reading process for the dicing frame F is performed in the standby station 13. Then, the edge cut process for the DF-attached laminated substrate T is performed in the edge cut station 14. Thereafter, the delamination process for the DF-attached laminated substrate T is performed in the delamination station 15. Further, in the first processing block 10, the delaminated target substrate W is cleaned in the first cleaning station 16 and then the cleaned target substrate W is transferred to the carry-in/carry-out station 11. Thereafter, the cleaned target substrate W is carried out of the carry-in/carry-out station 11.

Subsequently, the configuration of the second processing block 20 will be described. A delivery process of receiving the delaminated support substrate S from the delamination station 15 and then delivering it to the second cleaning station 22 is performed in the delivery station 21. The delivery station 21 includes a third transfer device 50, which is configured to hold the delaminated support substrate S in a non-contact manner and to transfer the delaminated support substrate S. The delivery process is performed using the third transfer device 50. The detailed configuration of the third transfer device 50 will be described below.

A second cleaning process of cleaning the delaminated support substrate S is performed in the second cleaning station 22. A second cleaning device, which is configured to clean the delaminated support substrate S, is provided in the second cleaning station 22. The detailed configuration of the second cleaning device 22 will be described below.

The transfer of the support substrate S cleaned by the second cleaning device is performed in the second transfer region 23. A second transfer device 40 configured to transfer the support substrate S is provided in the second transfer region 23.

The second transfer device 40 is a substrate transfer device that includes a transfer arm unit and a substrate holding unit provided at a tip end of the transfer arm unit. The transfer arm unit is capable of movement in a horizontal direction, up-and-down movement in a vertical direction and rotation around the vertical direction. The second transfer device 40 holds a substrate using the substrate holding unit and transfers the substrate held by the substrate holding unit to the carry-out station 24 using the transfer arm unit. The substrate holding unit of the second transfer device 40 may comprise a fork that substantially horizontally holds the support substrate S by supporting the support substrate S from below.

Cassettes Cs receiving the support substrate S are carried in from the outside or carried out to the outside in the carry-out station 24. A cassette placing table is provided in the carry-out station 24. A plurality of cassette placing plates 240a and 240b on each of which the cassette Cs is placed are provided on the cassette placing table.

In the above-described second processing block 20, the delaminated support substrate S is transferred from the delamination station 15 to the second cleaning station 22 through the delivery station 21 and is then cleaned in the second cleaning station 22. Thereafter, in the second processing block 20, the cleaned support substrate S is transferred to the carry-out station 24 and is carried out of the carry-out station 24.

The delamination system 1 further includes a control device 60. The control device 60 is a device configured to control the operation of the delamination system 1. The control device 60 is, for example, a computer, and includes a control unit (not shown) and a storage unit (not shown). The storage unit stores a program for controlling various processes such as the delamination process. The control unit reads out and executes the program stored in the storage unit, thereby controlling the operation of the delamination system 1.

Further, the aforementioned program may be stored in a computer-readable recording medium and may be installed from the recording medium into the storage unit of the control device 60. The computer-readable recording medium may include a hard disk (HD), a flexible disk (FD), a compact disk (CD), a magneto-optical disk (MO), a memory card or the like.

Figure 4:
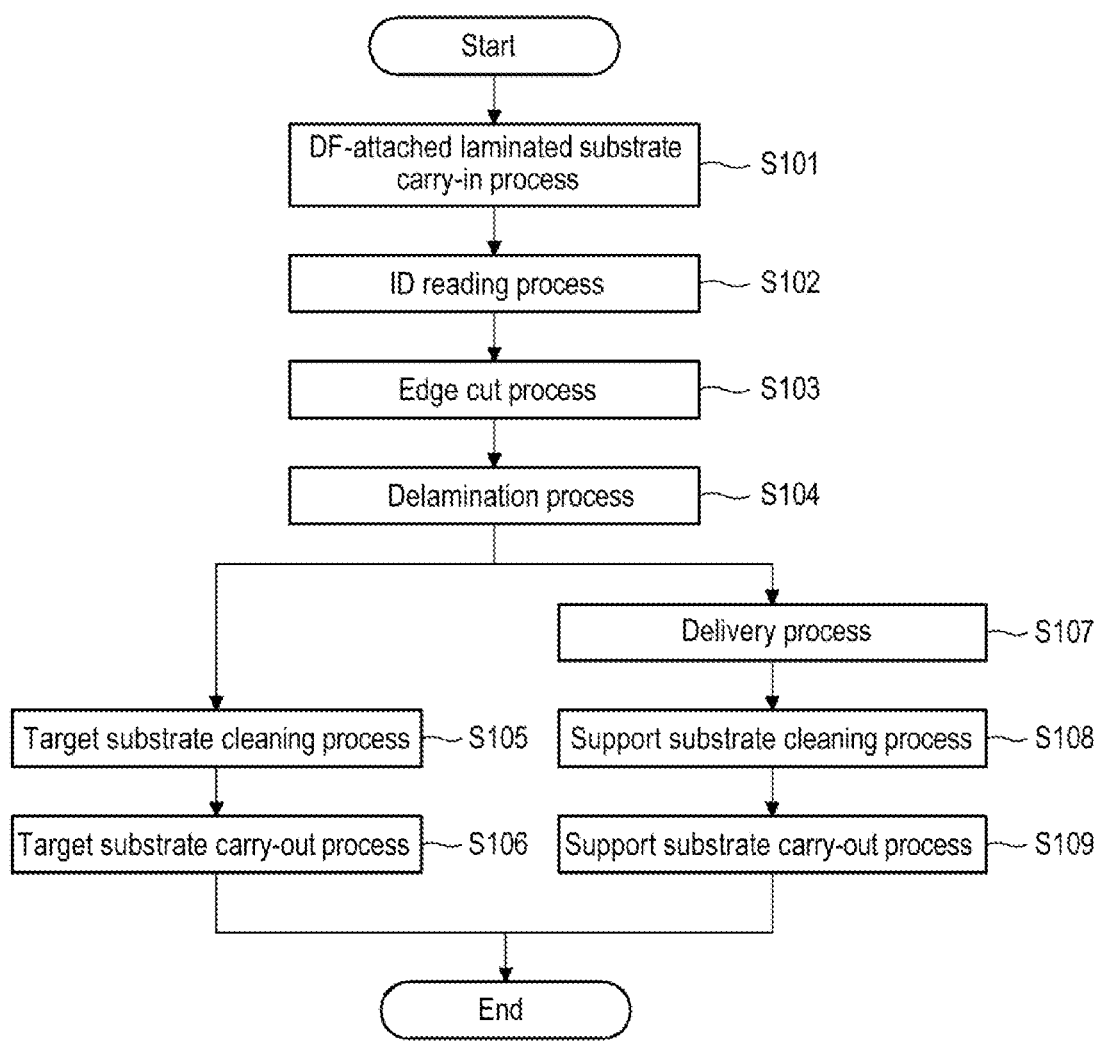
FIG. 4 is a flowchart showing the procedures of substrate processes performed by the delamination system.
Figure 5A:
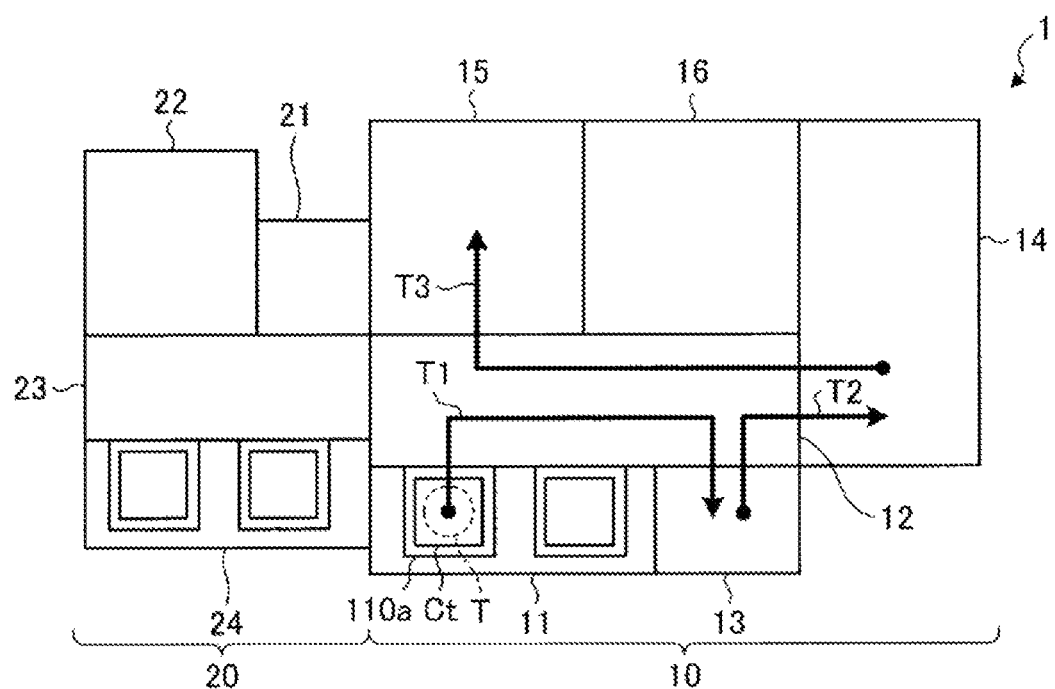
FIG. 5A is a schematic view showing the transfer route of a DF-attached laminated substrate.
Figure 5B:
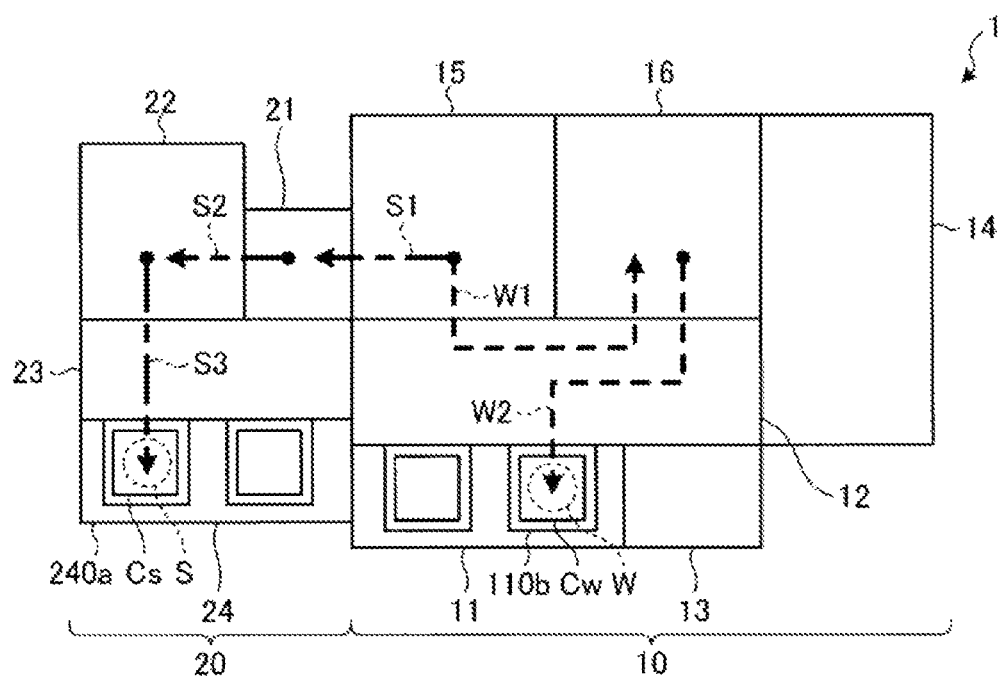
FIG. 5B is a schematic view showing the transfer routes of a target substrate and a support substrate.

The operation of the above-described delamination system 1 will be described with reference to FIGS. 4, 5A and 5B. FIG. 4 is a flowchart illustrating the process procedures of the substrate process performed by the delamination system 1. FIG. 5A is a schematic view showing the transfer route of a DF-attached laminated substrate T. FIG. 5B is a schematic view showing the transfer route of the target substrate W and the support substrate S. The delamination system 1 performs each process procedure shown in FIG. 4 under the control of the control device 60.

First, the first transfer device 30 (see FIG. 1), which is disposed in the first transfer region 12 of the first processing block 10, performs a process of carrying in the DF-attached laminated substrate T into the standby station 13 under the control of the control device 60 (see process S101 in FIG. 4 and T1 in FIG. 5A).

Specifically, the first transfer device 30 advances the substrate holding unit to the carry-in/carry-out station 11 and allows the substrate holding unit to hold the DF-attached laminated substrate T accommodated in the cassette Ct. Then, the first transfer device 30 removes the DF-attached laminated substrate T from the cassette Ct. In this case, the substrate holding unit of the first transfer device 30 holds the DF-attached laminated substrate T from above as the target substrate W is positioned downward and the support substrate S is positioned upward. Then, the first transfer device 30 carries the DF-attached laminated substrate Tm, which is removed from the cassette Ct, into the standby station 13.

Subsequently, in the standby station 13, the ID reading device performs an ID reading process of reading the ID of the dicing frame F under the control of the control device 60 (process S102 in FIG. 4). The ID read out by the ID reading device is transmitted to the control device 60.

Subsequently, under the control of the control device 60, the first transfer device 30 carries the DF-attached laminated substrate T out of the standby station 13 and transfers the DF-attached laminated substrate T to the edge cut station 14 (see T2 in FIG. 5A). In the edge cut station 14, the edge cut device performs the edge cut process under the control of the control device 60 (process S103 in FIG. 4). Since the peripheral edge of the bonding agent G is removed through the edge cut process, the target substrate W and the support substrate S can be easily delaminated in the subsequent delamination process. Accordingly, the time needed for the delamination process can be shortened.

In the delamination system 1 according to the first embodiment, the edge cut station 14 is incorporated into the first processing block 10. Therefore, the DF-attached laminated substrate T carried into the first processing block 10 can be directly carried into the edge cut station 14 using the first transfer device 30. Thus, the throughput from serial substrate processing processes can be improved in the delamination system 1. Further, the time spent from the edge cut process to the delamination process can be easily managed and the delamination performance can be stabilized.

Further, when the DF-attached laminated substrate T to be processed exists due to the difference in processing time between devices, the DF-attached laminated substrate T may be kept temporarily in a standby state by the temporary standby unit provided in the standby station 13. This can reduce the time loss between serial processes.

Next, under the control of the control device 60, the first transfer device 30 carries the DF-attached laminated substrate T subjected to the edge cut process out of the edge cut station 14 and transfers the DF-attached laminated substrate T to the delamination station 15 (see T3 in FIG. 5A). In the delamination station 15, the delamination device performs a delamination process under the control of the control device 60 (process S104 in FIG. 4).

Thereafter, in the delamination system 1, the delaminated target substrate W is processed in the first processing block 10 and the delaminated support substrate S is processed in the second processing block 20. The delaminated target substrate W is held by the dicing frame F.

First, in the first processing block 10, under the control of the control device 60, the first transfer device 30 carries the delaminated target substrate W out of the delamination device and transfers the delaminated target substrate W to the first cleaning station 16 (see W1 in FIG. 5B).

Then, under the control of the control device 60, the first cleaning device performs a target substrate cleaning process of cleaning the bonding surface Wj of the delaminated target substrate W (process S105 in FIG. 4). The bonding agent G remaining on the bonding surface Wj of the target substrate W is removed through the target substrate cleaning process.

Subsequently, under the control of the control device 60, the first transfer device 30 performs a target substrate carry-out process of carrying the cleaned target substrate W out of the first cleaning device and transferring the cleaned target substrate W to the carry-in/carry-out station 11 (see process S106 in FIG. 4 and W2 in FIG. 5B). Thereafter, the target substrate W is carried out of the carry-in/carry-out station 11 for collection. Thus, the process for the target substrate W is finished.

Further, the second processing block 20 performs the processes S107 to S109 in parallel with the processes S105 and S106.

First, in the second processing block 20, the third transfer device 50 provided in the delivery station 21 performs the delivery process for the delaminated support substrate S under the control of the control device 60 (process S107 in FIG. 4).

In the process S107, the third transfer device 50 receives the delaminated support substrate S from the delamination device (see 51 in FIG. 5B) and places the received support substrate S on the second cleaning device of the second cleaning station 22 (see S2 in FIG. 5B).

In this case, the delaminated support substrate S is supported by the delamination device at its top surface (i.e., the non-bonding surface Sn) and the third transfer device 50 holds the bonding surface Sj of the support substrate S from below in a non-contact manner. Then, the third transfer device 50 carries the support substrate S into the second cleaning station 22 and then turns upside down the support substrate S and thereafter places the support substrate S onto the second cleaning device. Thus, the support substrate S is placed on the second cleaning device with the bonding surface Sj facing upward. Then, under the control of the control device 60, the second cleaning device performs a support substrate cleaning process of cleaning the bonding surface Sj of the support substrate S (process S108 in FIG. 4). The bonding agent G remaining on the bonding surface Sj of the support substrate S is removed through the support substrate cleaning process.

Subsequently, under the control of the control device 60, the second transfer device 40 performs a support substrate carry-out process of carrying the cleaned support substrate S out of the second cleaning device and transferring the cleaned support substrate S to the carry-out station 24 (see process S109 in FIG. 4 and S3 in FIG. 5B). Thereafter, the support substrate S is carried out of the carry-out station 24 for collection. Thus, the processes for the support substrate S are finished.

As described above, the delamination system 1 according to the first embodiment is configured to include a front end for the substrate held by the dicing frame F (e.g., the carry-in/carry-out station 11 and the first transfer device 30) and a front end for the substrate not held by the dicing frame F (e.g., the carry-out station 24 and the second transfer device 40). Thus, the process of transferring the cleaned target substrate W to the carry-in/carry-out station 11 and the process of transferring the cleaned support substrate S to the carry-out station 24 can be performed in parallel and the serial substrate processing processes can be efficiently performed.

Further, in the delamination system 1 according to the first embodiment, the first processing block 10 and the second processing block 20 are connected to each other via the delivery station 21. Thus, the delaminated support substrate S can be directly removed from the delamination station 15 and be carried into the second processing block 20. It is therefore possible to smoothly transfer the delaminated support substrate S to the second cleaning device.

Accordingly, the delamination system 1 according to the first embodiment can improve the throughput of the serial substrate processing processes.

2. Configurations of Each Device

<2-1. Delamination Device>

Figure 6:
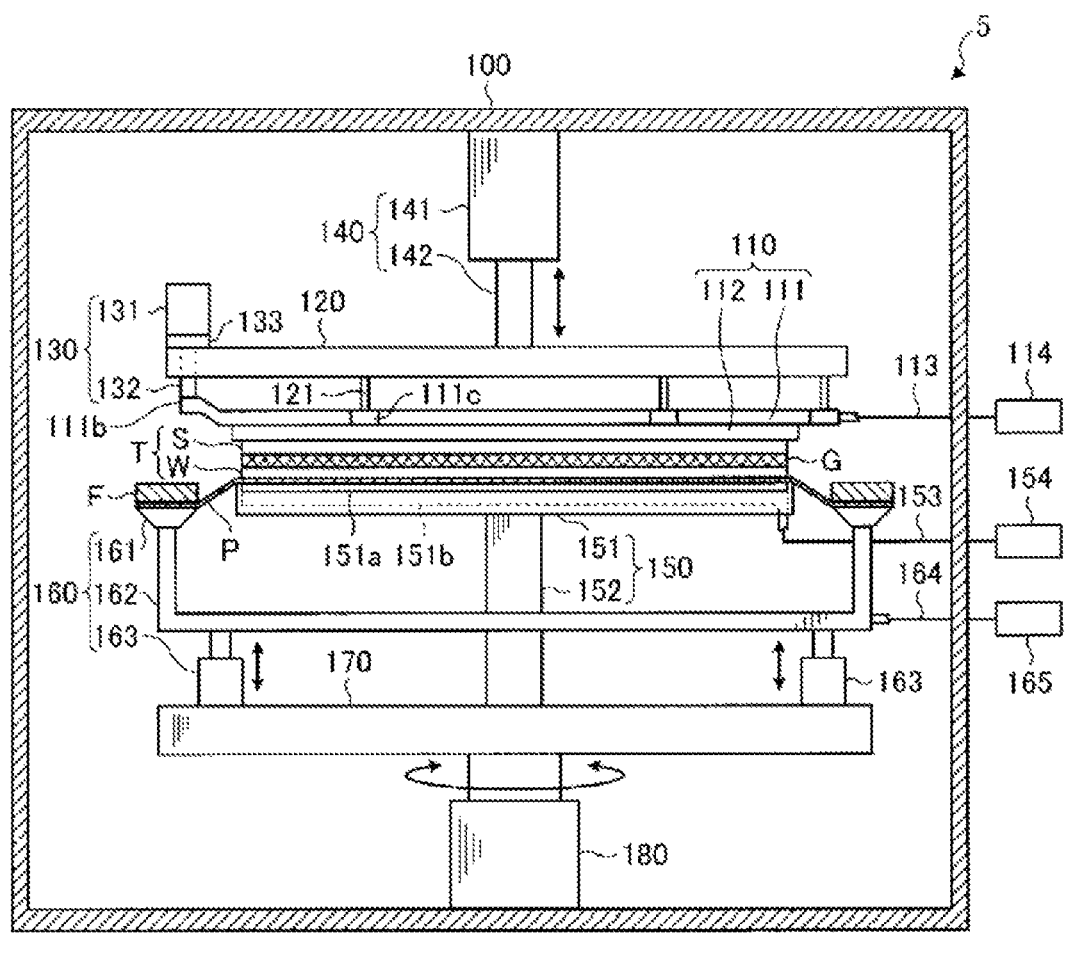
FIG. 6 is a schematic side view showing the configuration of a delamination device according to the first embodiment.

The configuration of each device included in the delamination system 1 will be described in detail. The configuration of the delamination device provided in the delamination station 15 and the delamination operation for the DF-attached laminated substrate T performed by the delamination device will first be described. FIG. 6 is a schematic side view showing the configuration of the delamination device according to the first embodiment.

As shown in FIG. 6, the delamination device 5 includes a processing unit 100. Carry-in/carry-out openings (not shown) are formed in side surfaces of the processing unit 100. Through the carry-in/carry-out openings, the DF-attached laminated substrate T is carried into the processing unit 100 and the delaminated target substrate W and the delaminated support substrate S are carried out of the processing unit 100. For example, an opening/closing shutter is provided in each of the carry-in/carry-out openings. The opening/closing shutters isolate the processing unit 100 from external regions, preventing particles from entering the processing unit 100. The carry-in/carry-out openings are respectively formed in the side surface of the processing unit 100 adjoining the first transfer region 12 and the side surface of the processing unit 100 adjoining the delivery station 21.

The delamination device 5 includes a first holding unit 110, an upper base unit 120, a local movement unit 130 and a movement mechanism 140. The delamination device 5 further includes a second holding unit 150, a frame holding unit 160, a lower base unit 170 and a rotation mechanism 180. These components of the delamination device 5 are disposed within the processing unit 100.

The first holding unit 110 is supported by the upper base unit 120 from above. The upper base unit 120 is supported by the movement mechanism 140. The movement mechanism 140 moves the upper base unit 120 in the vertical direction. In other words, the movement mechanism 140 moves the first holding unit 110 upward or downward in the vertical direction.

The second holding unit 150 is disposed below the first holding unit 110. The frame holding unit 160 is disposed outside the second holding unit 150. The second holding unit 150 and the frame holding unit 160 are supported by the lower base unit 170 from below. The lower base unit 170 is supported by the rotation mechanism 180. The rotation mechanism 180 rotates the lower base unit 170 around the vertical axis and thereby the second holding unit 150 and the frame holding unit 160 are rotated around the vertical axis.

In the delamination device 5, the first holding unit 110 holds the DF-attached laminated substrate T from above and the second holding unit 150 holds the DF-attached laminated substrate T from below. Further, the local movement unit 130 moves a portion of the outer peripheral portion of the first holding unit 110 away from the second holding unit 150. Thus, the delamination device 5 can delaminate the support substrate S from the target substrate W while the delamination progresses from the outer peripheral portion of the support substrate S toward the central portion thereof. Each component of the delamination device 5 will be described below in more detail.

Figure 7B:
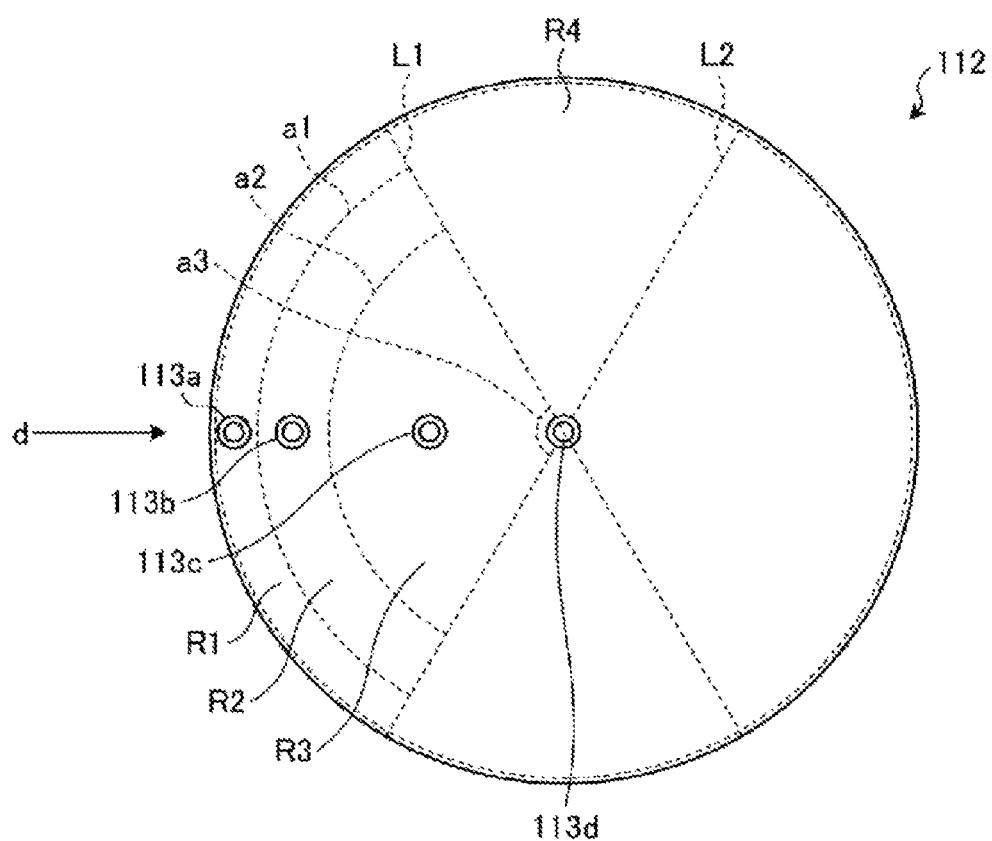
FIG. 7B is a schematic plan view showing the configuration of a suction pad.

The first holding unit 110 is a holding unit configured to suck and hold the support substrate S constituting the DF-attached laminated substrate T. The first holding unit 110 comprises a pliable member so that the shape of the first holding unit 110 can pliably change when the first holding unit 110 is pulled by the local movement unit 130. Now, the detailed configuration of the first holding unit 110 will be described with reference to FIGS. 7A and 7B. FIG. 7A is a schematic perspective view showing the configuration of the first holding unit 110. FIG. 7B is a schematic top view showing the configuration of a suction pad.

As shown in FIG. 7A, the first holding unit 110 includes a thin plate-shaped body portion 111 and a suction pad 112 attached to the surface of the body portion 111. The body portion 111 comprises an elastic member such as a leaf spring or the like. The suction pad 112 comprises a resin member.

The body portion 111 has a disc section 111a having a diameter substantially equal to the diameter of the DF-attached laminated substrate T. The suction pad 112 is attached to a bottom surface of the disc section 111a.

A pulling section 111b is provided in an outer periphery of the disc section 111a. An attachment portion 111b1 for attaching a cylinder 132 of the local movement unit 130 (this will be described below) is formed at a tip end of the pulling section 111b.

A plurality of fixing sections 111c are provided in the outer periphery of the disc section 111a. The fixing sections 111c are provided in the positions corresponding to support members 121 of the upper base unit 120 (this will be described below) and are fixed to the support members 121. The first holding unit 110 is supported by the upper base unit 120 as the fixing sections 111c are fixed to the support members 121 of the upper base unit 120.

Although FIG. 7A illustrates that five fixing sections 111c are provided in the disc section 111a, the number of the fixing sections 111c provided in the disc section 111a is not limited to five.

The suction pad 112 is a disc-shaped resin member in which a suction region for the DF-attached laminated substrate T is formed. As shown in FIG. 7B, the suction region of the suction pad 112 is divided into a plurality of individual regions R1 to R4 by a plurality of straight lines L1 and L2 radially extending from a center of the suction pad 112 and by a plurality of circular arcs a1 to a3.

Suction ports 113a to 113d are formed in the individual regions R1 to R4, respectively. The respective suction ports 113a to 113d are connected to a suction device 114 such as a vacuum pump or the like through a suction pipe 113 shown in FIG. 6. The first holding unit 110 sucks the support substrate S constituting the DF-attached laminated substrate T through each of the suction ports 113a to 113d by virtue of suction of the suction device 114 and thus holds the support substrate S at each individual region R1 to R4.

As such, the suction region of the suction pad 112 is divided into the plurality of individual regions R1 to R4 and the support substrate S is held by virtue of suction at each individual region R1 to R4. Thus, even if air is leaked in some of the individual regions, the support substrate S can be appropriately held through other individual regions.

Further, as to the respective individual regions R1 to R4, the individual region defined at a rear side of a delamination progress direction d is larger than the individual region defined at a front side of the delamination progress direction d. By way of example, the individual regions R1 to R3 are disposed along the delamination progress direction d in the order of the individual region R1, the individual region R2 and the individual region R3. The individual region R2 is larger than the individual region R1. The individual region R3 is larger than the individual region R2.

If the suction region is smaller, then the suction force may be larger in that suction region. With the above-described configuration, the suction force in the individual region R1 defined at the rear side of the delamination progress direction d can be larger than the suction force in other individual regions R2 to R4. The individual region defined at the rear side of the delamination progress direction d is a region where the largest force is required during delaminating the target substrate W and the support substrate S. Therefore, by increasing the suction force in the individual region defined at the rear side of the delamination progress direction d, the target substrate W and the support substrate S can be reliably delaminated.

Further, the suction ports 113a to 113d of the individual regions R1 to R4 are formed in a line along the delamination progress direction d. Thus, the support substrate S can be reliably held during the delamination operation.

In this embodiment, although the lines L1 and L2 are illustrated as straight lines, the lines L1 and L2 do not need to be necessarily a straight line. Further, in this embodiment, one suction device 114 is connected to the suction ports 113a to 113d, but suction devices may be provided for each of the suction ports 113a to 113d.

The configuration of the delamination device 5 will continually be described with reference to FIG. 6. The upper base unit 120 is located opposite to the first holding unit 110 with a gap therebetween. A plurality of the support members 121 are formed on the underside of the upper base unit 120 to protrude toward the first holding unit 110. The support members 121 and the fixing sections 111c of the first holding unit 110 are fixed to each other, whereby the first holding unit 110 is supported by the upper base unit 120.

The local movement unit 130 moves a portion of the outer periphery portion of the first holding unit 110 away from the second holding unit 150. Specifically, the local movement unit 130 includes a body portion 131 and the cylinder 132. The body portion 131 is fixed to the upper base unit 120. The cylinder 132 is fixed to the body portion 131 at its base end and is moved in the vertical direction by the body portion 131. A leading end portion of the cylinder 132 is fixed to the attachment portion 111b1 of the pulling section 111b (see FIG. 7A), which is provided in the body portion 111 of the first holding unit 110.

The local movement unit 130 moves the cylinder 132 vertically upward by the body portion 131. As a result, the pulling section 111b fixed to the cylinder 132 is vertically moved upward. In other words, said portion of the outer periphery portion of the support substrate S held by the first holding unit 110 is moved vertically upward and is delaminated from the target substrate W held by the second holding unit 150.

A load cell 133 is provided in the local movement unit 130. The local movement unit 130 can detect a load applied to the cylinder 132 by the load cell 133. The local movement unit 130 can pull the first holding unit 110 while controlling the force applied vertical upward to the support substrate S based on the detection result obtained by the load cell 133.

Figure 8A:
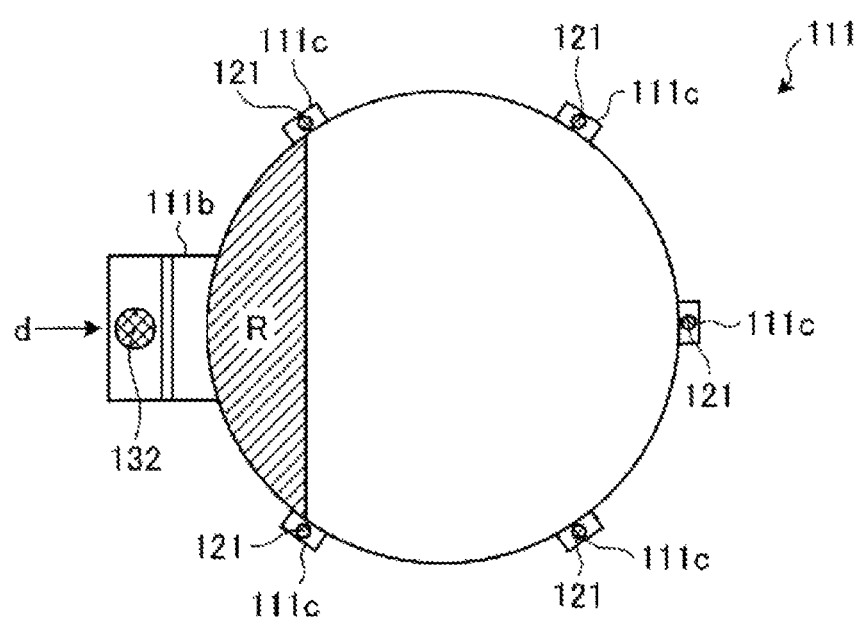
FIG. 8A is a schematic top view showing a body portion of a first holding unit.
Figure 8B:
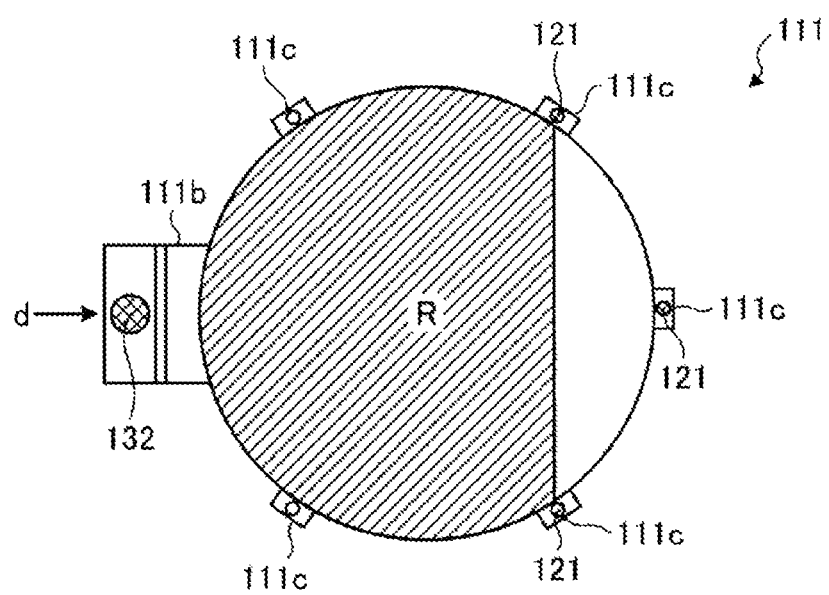
FIG. 8B is another schematic top view showing a body portion of a first holding unit.

In the delamination device 5 according to the first embodiment, the movement of the first holding unit 110 caused by the local movement unit 130 may be adjusted by fixing all or some of the fixing sections 111c of the body portion 111 of the first holding unit 110 to the support members 121. This will be described with reference to FIGS. 8A and 8B. FIGS. 8A and 8B are schematic top views of the body portion 111 of the first holding unit 110.

If five fixing sections 111c provided in the body portion 111 of the first holding unit 110 are all fixed to the support members 121 as shown in FIG. 8A, a region R in which the first holding unit 110 can be moved by the local movement unit 130 is limited to the region ranging from the rear side of the delamination progress direction d to the two fixing sections 111c positioned nearest to the rear side. In contrast, if the support members 121 are removed from the two fixing sections 111c positioned at the rear side of the delamination progress direction d as shown in FIG. 8B, then the region R in which the first holding unit 110 can be moved by the local movement unit 130 can be set larger than the region R shown in FIG. 8A.

As described above, the fixing sections 111c are configured to fix the first holding unit 110 to the upper base unit 120. In addition, the fixing sections 111c are provided along the circumferential direction of the outer periphery portion of the body portion 111 and are fixed to the support members 121. Thus, the fixing sections 111c are configured to limit the movement of the first holding unit 110 caused by the local movement unit 130.

The configuration of the delamination device 5 will be continually described with reference to FIG. 6. The movement mechanism 140 is disposed above the upper base unit 120. The movement mechanism 140 includes a body portion 141 and a drive unit 142. The body portion 141 is fixed to a ceiling of the processing unit 100. The drive unit 142 is fixed to the body portion 141 at its base end and is configured to move up and down along the vertical direction. A motor or a cylinder may be used as the drive unit 142. The drive unit 142 is coupled to the upper base unit 120 at its leading end.

The movement mechanism 140 moves the drive unit 142 vertically upward by the body portion 141, thereby moving the upper base unit 120 coupled to the drive unit 142 along the vertical direction. Thus, the first holding unit 110 and the local movement unit 130, which are supported by the upper base unit 120, are moved up and down.

The second holding unit 150 is disposed below the first holding unit 110 to be opposite to the first holding unit 110. The second holding unit 150 sucks and holds the target substrate W, which constitutes the DF-attached laminated substrate T, via the dicing tape P.

The second holding unit 150 includes a disc-shaped body portion 151 and a prop member 152 supporting the body portion 151. The prop member 152 is supported on the lower base unit 170.

The body portion 151 comprises a metal member made of aluminum or the like. The body portion 151 has a suction surface 151a on its top side. The suction surface 151a has a diameter substantially equal to the diameter of the DF-attached laminated substrate T. The suction surface 151a contacts the bottom surface of the DF-attached laminated substrate T (i.e., the non-bonding surface Wn of the target substrate W). The suction surface 151a comprises a porous body or porous ceramics made of silicon carbide or the like.

A suction space 151b communicating with the outside through the suction surface 151a is formed in the body portion 151. The suction space 151b is connected to a suction device 154 such as a vacuum pump or the like through a suction pipe 153.

The second holding unit 150 holds the target substrate W in such a manner that the non-bonding surface Wn of the target substrate W is sucked to the suction surface 151a via the dicing tape P under a negative pressure generated by the suction of the suction device 154. In this embodiment, although a porous chuck is used as the second holding unit 150, the second holding unit 150 is not limited thereto. By way of example, an electrostatic chuck may be used as the second holding unit 150.

The frame holding unit 160 is disposed at the outside of the second holding unit 150. The frame holding unit 160 holds the dicing frame F from below. The frame holding unit 160 includes: a plurality of suction portions 161 configured to suck and hold the dicing frame F; a support member 162 configured to support the suction portions 161; and a movement mechanism 163 fixed to the lower base unit 170 and configured to move the support member 162 along the vertical direction.

The suction portions 161 are made of an elastic member such as rubber or the like and are positioned in the four positions corresponding to front, rear, left and right locations of the dicing frame F shown in FIG. 3. The suction portions 161 are formed with suction ports (not shown), which are connected to a suction device 165 such as a vacuum pump or the like through the support member 162 and the suction pipe 164.

The frame holding unit 160 holds the dicing frame F in such a manner that the dicing frame F is sucked by means of a negative pressure generated by the suction of the suction device 165. Further, the frame holding unit 160 moves the support member 162 and the suction portions 161 along the vertical direction by the movement mechanism 161 while holding the dicing frame F, thus moving the dicing frame F along the vertical direction.

The lower base unit 170 is disposed below the second holding unit 150 and the frame holding unit 160 to support the second holding unit 150 and the frame holding unit 160. The lower base unit 170 is supported by the rotation mechanism 180 that is fixed to a floor surface of the processing unit 100. The lower base unit 170 is rotated around the vertical axis by the rotation mechanism 180, whereby the second holding unit 150 and the frame holding unit 160 supported on the lower base unit 170 are rotated around the vertical axis.

Next, the operation of the delamination device 5 will be described with reference to FIGS. 9 and 10A to 10E. FIG. 9 is a flowchart showing the process procedures of the delamination process. FIGS. 10A to 10E illustrate the delamination operation performed by the delamination device 5. Under the control of the control device 60, the delamination device 5 performs each process shown in FIG. 9.

First, the frame holding unit 160 of the delamination device 5 sucks and holds, from below, the dicing frame F of the DF-attached laminated substrate T, which is carried into the delamination station 15 by the first transfer device 30 (process S201). In this case, the DF-attached laminated substrate T is held only by the frame holding unit 160 (see FIG. 10A).

Subsequently, the movement mechanism 163 (see FIG. 6) of the delamination device 5 moves the frame holding unit 160 downward (process S202). Thus, the target substrate W of the DF-attached laminated substrate T contacts the second holding unit 150 via the dicing tape P (see FIG. 10B). Thereafter, the second holding unit 150 of the delamination device 5 sucks and holds the DF-attached laminated substrate T (process S203). Then, the DF-attached laminated substrate T is supported as the target substrate W is held by the second holding unit 150 and the dicing frame F is held by the frame holding unit 160.

Next, the movement mechanism 140 of the delamination device 5 moves the first holding unit 110 downward (process S204). Thus, the support substrate S of the DF-attached laminated substrate T contacts the first holding unit 110 via the suction pad 112 (see FIG. 10C). Thereafter, the first holding unit 110 of the delamination device 5 sucks and holds the support substrate S constituting the DF-attached laminated substrate T (process S205).

Subsequently, the local movement unit 130 of the delamination device 5 pulls the portion of the outer periphery portion of the first holding unit 110 (process S206). Specifically, the local movement unit 130 moves the pulling section 111b of the body portion 111 of the first holding unit 110 vertically upward by the actuation of the cylinder 132. Thus, the outer periphery portion of the DF-attached laminated substrate T is pulled vertically upward and the support substrate S begins to be delaminated from the target substrate W, in which the delamination progresses from the outer periphery portion of the support substrate S toward the central portion thereof (see FIG. 10D).

As described above, the first holding unit 110 is formed of a pliable member. Therefore, if the local movement unit 130 pulls the pulling section 111b of the first holding unit 110 vertically upward, then the first holding unit 110 pliably deforms along with the pulling operation. Accordingly, the delamination device 5 can delaminate the support substrate S from the target substrate W without applying a heavy load to the target substrate W.

Then, the movement mechanism 140 of the delamination device 5 moves the first holding unit 110 upward (process S207). Thus, the support substrate S is delaminated from the target substrate W. Thereafter, the delamination device 5 finishes the delamination process.

Further, after the target substrate W and the support substrate S are delaminated from each other, the rotation mechanism 180 of the delamination device 5 may rotate the second holding unit 150 and the frame holding unit 160. Thus, even if the bonding agent G adheres to the support substrate S and the target substrate W, such a bonding agent G can be twisted and then cut.

Figure 10A:
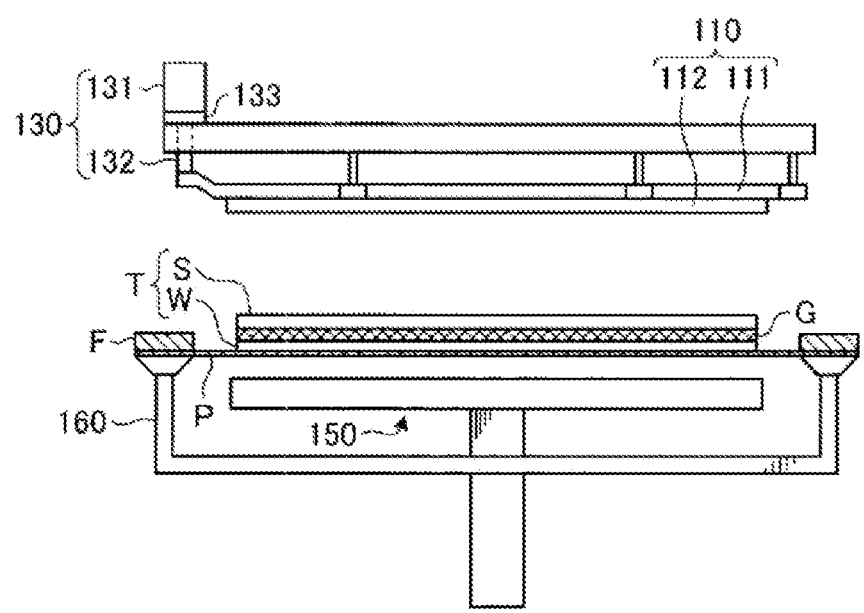
FIG. 10A is a view illustrating a delamination operation performed by the delamination device.
Figure 10B:
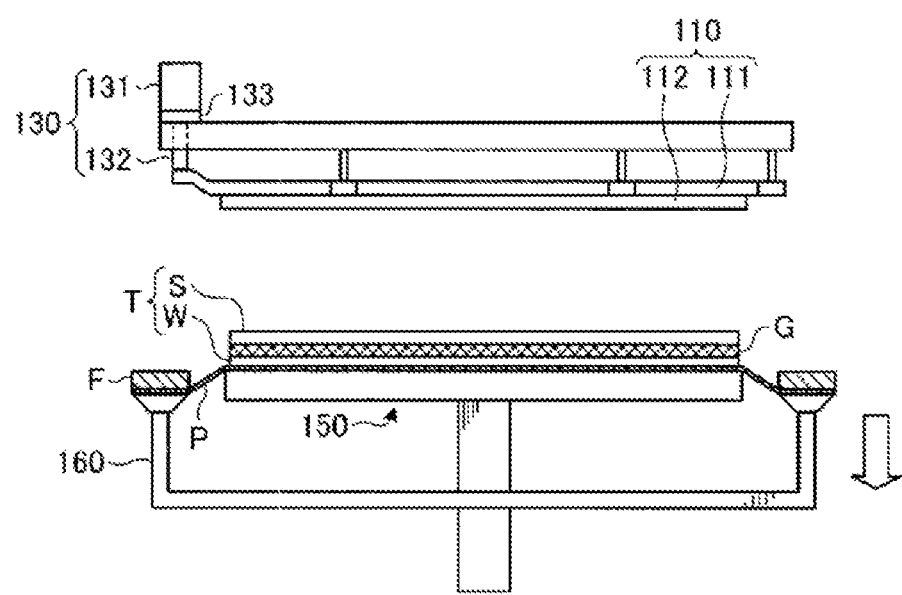
FIG. 10B is a view illustrating the delamination operation performed by the delamination device.
Figure 10C:
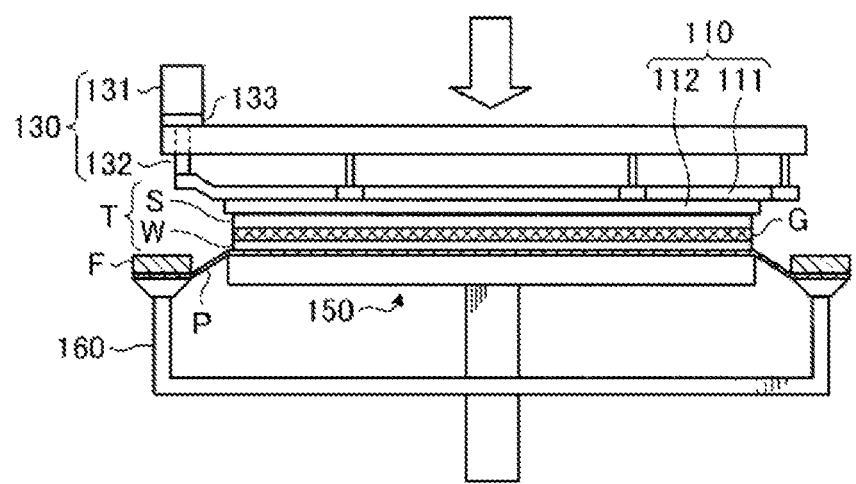
FIG. 10C is a view illustrating the delamination operation performed by the delamination device.
Figure 10D:
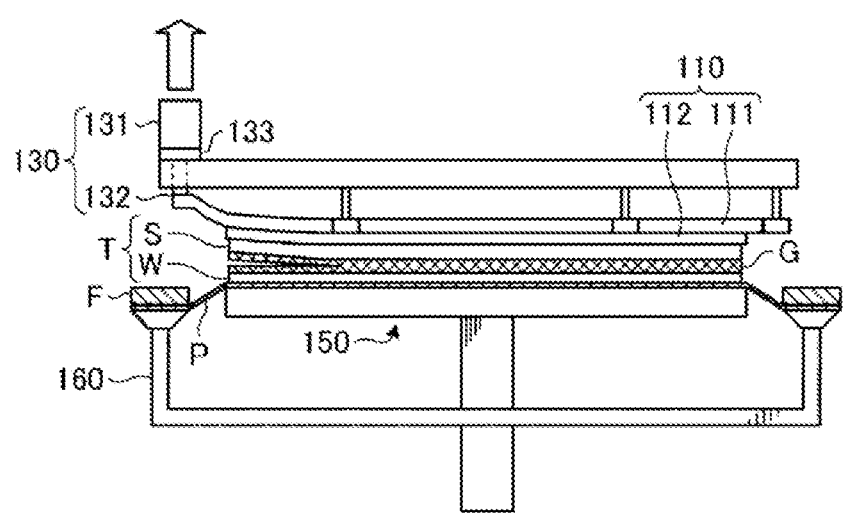
FIG. 10D is a view illustrating the delamination operation performed by the delamination device.
Figure 10E:
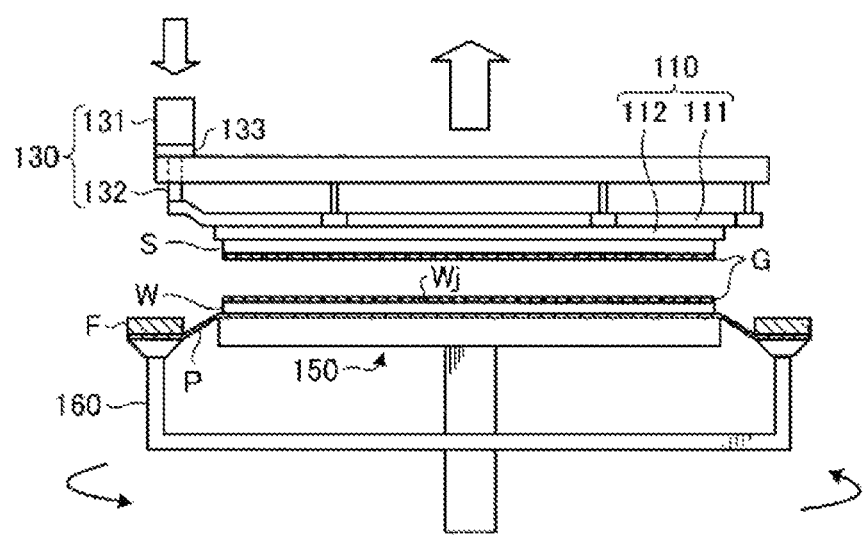
FIG. 10E is a view illustrating the delamination operation performed by the delamination device.

After the delamination device 5 finishes the delamination process, the first transfer device 30 carries the delaminated target substrate W out of the delamination device 5 and transfers the delaminated target substrate W to the first cleaning station 16. At this time, as shown in FIG. 10E, the delaminated target substrate W is held by the second holding unit 150 as the bonding surface Wj to be cleaned faces upward. Thus, the first transfer device 30 can transfer the delaminated target substrate W to the first cleaning station 16 without turning upside down the target substrate W after carrying the delaminated target substrate W out of the delamination device 5.

In the delamination device 5 according to the above-described first embodiment, the first holding unit 110 holds the support substrate S of the DF-attached laminated substrate T from above and the second holding unit 150 holds the target substrate W of the DF-attached laminated substrate T from below via the dicing tape P. Therefore, the delamination device 5 does not need to turn upside down the delaminated target substrate W, enhancing the efficiency of the delamination process.

In the delamination device 5 according to the first embodiment, the first holding unit 110 is made of a pliable member. Thus, the support substrate S can be delaminated from the target substrate W without applying a heavy load to the target substrate W. Thus, the delamination process for the support substrate S and the target substrate W can be efficiently performed.

<2-2. First Cleaning Device>

Figure 11A:
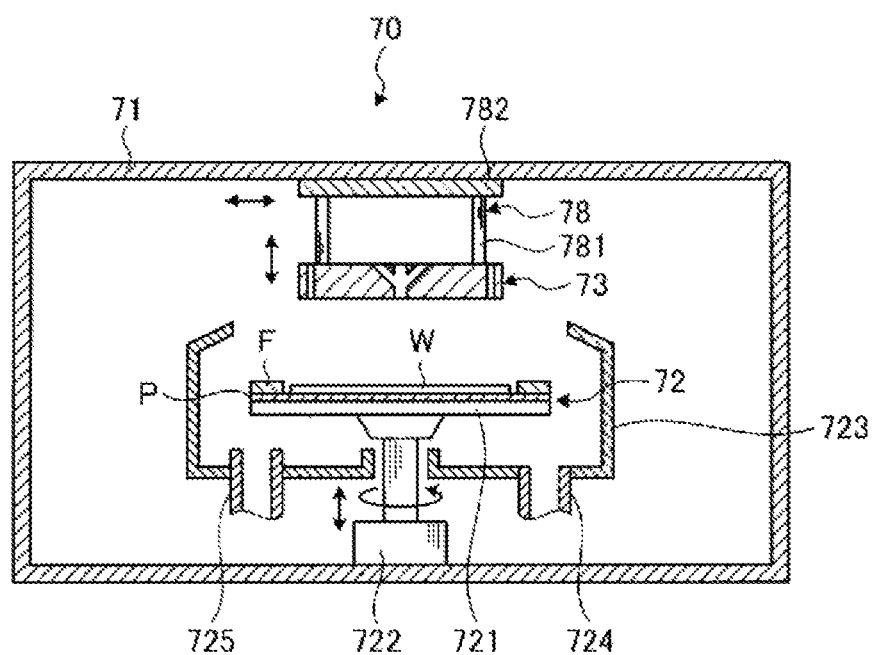
FIG. 11A is a schematic side view showing the configuration of a first cleaning device.
Figure 11B:
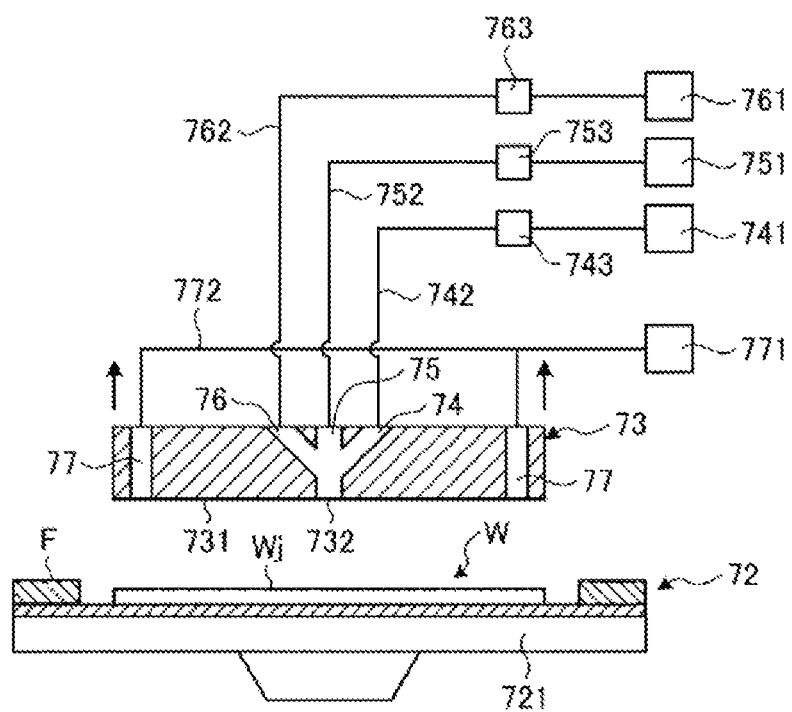
FIG. 11B is another schematic side view showing the configuration of the first cleaning device.
Figure 11C:
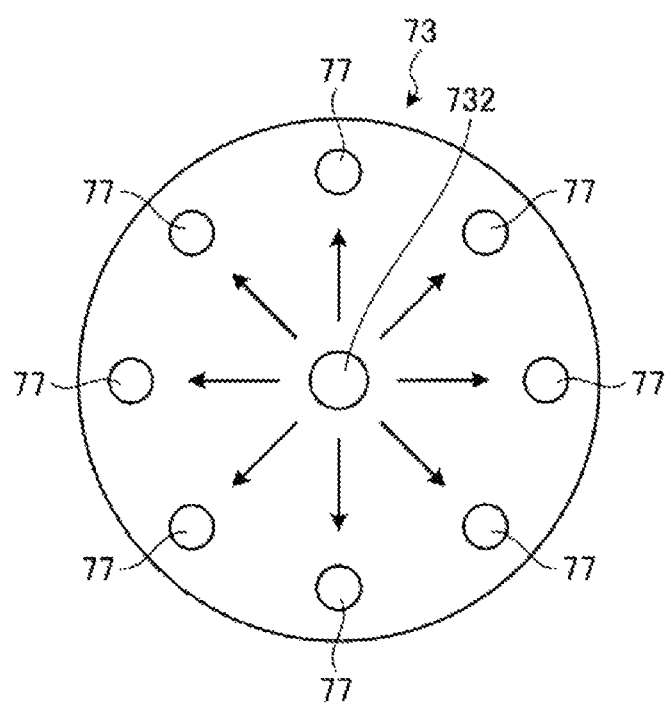
FIG. 11C is a schematic top view showing the configuration of a cleaning jig.

Next, the configuration of the first cleaning device will be described with reference to FIGS. 11A through 11C. FIGS. 11A and 11B are schematic side views showing the configuration of the first cleaning device. FIG. 11C is a schematic top view showing the configuration of a cleaning jig.

As shown in FIG. 11A, the first cleaning device 70 has a processing container 71. A carry-in/carry-out opening (not shown) for carrying in and out the target substrate W is formed in the side surface of the processing container 71. An opening/closing shutter (not shown) is provided in the carry-in/carry-out opening. A filter (not shown) for purifying an internal atmosphere of the processing container 71 is provided in the processing container 71.

A substrate holding unit 72 is centrally disposed in the processing container 71. The substrate holding unit 72 includes a spin chuck 721 which holds and rotates the dicing frame F and the target substrate W.

The spin chuck 721 has a horizontal top surface, in which suction ports (not shown) sucking, for example, the dicing tape P are formed. By the suction from the suction ports, the target substrate W is sucked and held on the spin chuck 721 via the dicing tape P. In this case, the target substrate W is sucked and held by the spin chuck 721 with its bonding surface Wj facing upward.

A chuck driving unit 722 including, e.g., a motor is disposed below the spin chuck 721. The spin chuck 721 is rotated at a predetermined speed by the chuck driving unit 722. The chuck driving unit 722 includes an up-and-down drive source such as a cylinder. The spin chuck 721 is moved up and down by the up-and-down drive source.

A cup 723, which receives and recovers the liquid scattering or falling from the target substrate W, is disposed around the substrate holding unit 72. A drain pipe 724 configured to drain the recovered liquid and an exhaust pipe 725 configured to vacuum the atmosphere within the cup 723 are connected to the underside of the cup 723.

A cleaning jig 73 configured to clean the bonding surface Wj of the target substrate W is disposed above the substrate holding unit 72. The cleaning jig 73 is located opposite to the target substrate W held by the substrate holding unit 72. The configuration of the cleaning jig 73 will be described with reference to FIGS. 11B and 11C.

As shown in FIGS. 11B and 11C, the cleaning jig 73 has a substantially disc-like shape. A supply surface 731 is formed at a bottom of cleaning jig 73 to cover at least the bonding surface Wj of the target substrate W. In this embodiment, the supply surface 731 has substantially the same size as the bonding surface Wj of the target substrate W.

A solvent supply portion 74 configured to supply a solvent for the bonding agent G (e.g., thinner) in between the supply surface 731 and the bonding surface Wj, a rinse liquid supply portion 75 configured to supply a rinse liquid for the solvent, and an inert gas supply portion 76 configured to supply an inert gas (e.g., a nitrogen gas) are provided in a central region of the cleaning jig 73. The solvent supply portion 74, the rinse liquid supply portion 75 and the inert gas supply portion 76 join inside the cleaning jig 73 and then extends to a supply outlet 732 formed in the supply surface 731 of the cleaning jig 73. That is, a solvent flow path from the solvent supply portion 74 to the supply outlet 732, a rinse liquid flow path from the rinse liquid supply portion 75 to the supply outlet 732 and an inert gas flow path from the inert gas supply portion 76 to the supply outlet 732 pass through the cleaning jig 73 in a thickness direction. Depending on the major component of the solvent for the bonding agent G, a variety of liquids is used as the rinse liquid. For example, pure water or IPA (isopropyl alcohol) may be used as the rinse liquid. To promote drying of the rinse liquid, a highly volatile liquid may be used as the rinse liquid.

A supply pipe 742, which communicates with a solvent supply source 741 storing a solvent therein, is connected to the solvent supply portion 74. A supply device 743, which comprises a valve or a flow rate controller for controlling the flow of a solvent, is provided at the supply pipe 742. A supply pipe 752, which communicates with a rinse liquid supply source 751 storing a rinse liquid therein, is connected to the rinse liquid supply portion 75. A supply device 753, which comprises a valve or a flow rate controller for controlling the flow of a rinse liquid, is provided at the supply pipe 752. A supply pipe 762, which communicates an inert gas supply source 761 storing an inert gas therein, is connected to the inert gas supply portion 76. A supply device 763, which comprises a valve or a flow rate controller for controlling the flow of an inert gas, is provided at the supply pipe 762.

Suction portions 77 for suctioning the solvent or rinse liquid existing in a clearance between the supply surface 731 and the bonding surface Wj are provided in the outer periphery portion of the cleaning jig 73. The suction portions 77 pass through the cleaning jig 73 in the thickness direction. Further, the suction portions 77 are positioned at an equal spacing in a plurality of locations (e.g., eight locations) along the circumference of the cleaning jig 73 (see FIG. 11C). A suction pipe 772 communicating with a negative pressure generating device 771 (e.g., a vacuum pump) is connected to each of the suction portions 77.

As shown in FIG. 11A, a movement mechanism 78, which moves the cleaning jig 73 vertically and horizontally, is provided in a ceiling surface of the processing container 71 above the cleaning jig 73. The movement mechanism 78 includes a support member 781 configured to support the cleaning jig 73 and a jig driving unit 782 configured to support the support member 781 and vertically and horizontally move the cleaning jig 73.

The first transfer device 30 places the target substrate W on the spin chuck 721 of the first cleaning device 70. Thus, the delaminated target substrate W is placed on the spin chuck 721 as the bonding surface Wj faces upward.

Then, under the control of the control device 60, the first cleaning device 70 performs a cleaning process (first cleaning process) for the target substrate W placed on the substrate holding unit 72.

First, the first cleaning device 70 sucks and holds the target substrate W and the dicing frame F using the spin chuck 721. Then, the first cleaning device 70 adjusts the horizontal position of the cleaning jig 73 and then moves the cleaning jig 73 downward to a predetermined position by the movement mechanism 78. In this case, a distance between the supply surface 731 of the cleaning jig 73 and the bonding surface Wj of the target substrate W is set to a distance at which, as described below, the solvent for the bonding agent G can be diffused due to a surface tension between the supply surface 731 and the bonding surface Wj.

Thereafter, the first cleaning device 70 supplies the solvent from the solvent supply source 741 to the solvent supply portion 74 while rotating the target substrate W by the spin chuck 721. The solvent is supplied from the supply outlet 732 to a space defined between the supply surface 731 and the bonding surface Wj. In this space, the solvent is diffused on the bonding surface Wj of the target substrate W due to the surface tension of the solvent and the centrifugal force caused by the rotation of the target substrate W. At this time, the first cleaning device 70 appropriately suctions the solvent by the suction portions 77 such that the solvent does not flow onto the dicing tape P. This can prevent the deterioration in strength of the dicing tape P caused by the solvent. In the above-described manner, the solvent is supplied to the entire bonding surface Wj of the target substrate W.

Thereafter, the first cleaning device 70 maintains, for a predetermined time (e.g., several minutes), the state that the bonding surface Wj of the target substrate W is immersed in the solvent. By doing so, the impurities such as the bonding agent G remaining on the bonding surface Wj are removed by the solvent.

Then, the first cleaning device 70 moves the cleaning jig 73 upward to a predetermined position while continuously rotating the target substrate W by the spin chuck 721 and continuously suctioning the solvent by the suction portions 77. Subsequently, the first cleaning device 70 supplies the rinse liquid from the rinse liquid supply source 751 to the rinse liquid supply portion 75. The rinse liquid is diffused on the bonding surface Wj of the target substrate W due to a surface tension and a centrifugal force while being mixed with the solvent. Thus, a mixture of the solvent and the rinse liquid is supplied to the entire bonding surface Wj of the target substrate W.

Thereafter, the first cleaning device 70 moves the cleaning jig 73 downward to a predetermined position while continuously rotating the target substrate W by the spin chuck 721 and continuously suctioning the mixture of the solvent and the rinse liquid by the suction portions 77. Then, the inert gas is supplied from the inert gas supply source 761 through the inert gas supply portion 76 and the supply outlet 732. The inert gas makes the mixture of the solvent and the rinse liquid flow outward of the target substrate W. Thus, the mixture of the solvent and the rinse liquid is suctioned through the suction portions 77 and is removed from the bonding surface Wj of the target substrate W.

Thereafter, the first cleaning device 70 dries the target substrate W by continuously rotating the target substrate W by the spin chuck 721 and continuously supplying the inert gas. Thus, the cleaning process (first cleaning process) for the target substrate W is finished. The cleaned target substrate W is carried out of the first cleaning device 70 and is transferred to the cassette Cw of the carry-in/carry-out station 11 by the first transfer device 30.

<2-3. Third Transfer Device>

Figure 12:
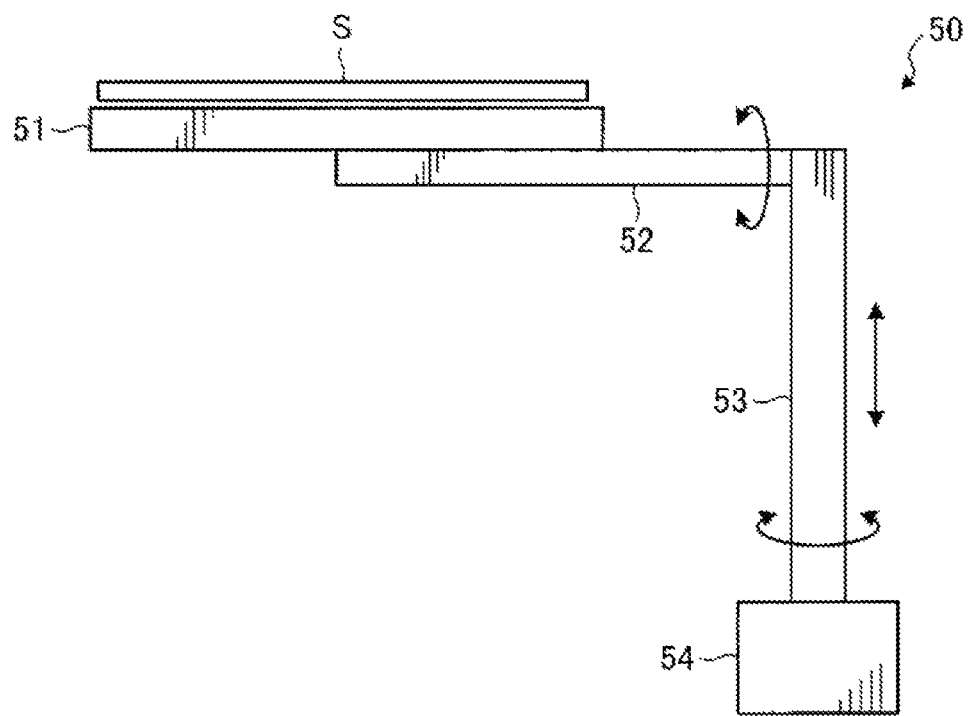
FIG. 12 is a schematic side view showing the configuration of a third transfer device.

Next, the configuration of the third transfer device 50 provided in the delivery station 21 will be described with reference to FIG. 12. FIG. 12 is a schematic side view showing the configuration of the third transfer device 50.

As shown in FIG. 12, the third transfer device 50 includes a Bernoulli chuck 51 holding the target substrate W. The Bernoulli chuck 51 injects a gas from an injection port formed on its suction surface toward the surface of the target substrate W. The Bernoulli chuck 51 holds the target substrate W in a non-contact manner by using the change in negative pressure, which is caused by the change in flow velocity of the gas according to the gap between the suction surface and the surface of the target substrate W.

Further, the third transfer device 50 includes a first arm 52, a second arm 53 and a base 54. The first arm 52 horizontally extends and supports the Bernoulli chuck 51 at its tip end. The second arm 53 vertically extends and supports a base end portion of the first arm 52 at its tip end. A drive mechanism rotating the first arm 52 around a horizontal axis is provided in the tip end portion of the second arm 53. By rotating the first arm 52 around the horizontal axis by means of the drive mechanism, the Bernoulli chuck 51 can be turned upside down.

The base 54 supports a base end portion of the second arm 53. A drive mechanism that rotates and vertically moves the second arm 53 is provided in the base 54. By rotating or vertically moving the second arm 53 by means of the drive mechanism, the Bernoulli chuck 51 can be moved up and down along the vertical axis and be swung around the vertical axis.

Under the control of the control device 60, the third transfer device 50 performs a delivery process of receiving the delaminated support substrate S from the delamination device 5 and then delivering the delaminated support substrate S to a second cleaning device 80.

Specifically, the third transfer device 50 holds the support substrate S, which is held from above by the first holding unit 110 of the delamination device 5, from below by means of the Bernoulli chuck 51. Thus, the support substrate S is held on the Bernoulli chuck 51 as the non-bonding surface Sn faces upward. Then, the third transfer device 50 rotates the second arm 53 around the vertical axis, thereby swinging the Bernoulli chuck 51. Thus, the support substrate S held on the Bernoulli chuck 51 is moved from the delamination station 15 to the second cleaning station 22 via the delivery station 21.

Subsequently, the third transfer device 50 rotates the first arm 52 around the horizontal axis, thereby turning upside down the Bernoulli chuck 51. Thus, the support substrate S is positioned as the non-bonding surface Sn faces downward. Then, the third transfer device 50 moves the Bernoulli chuck 51 downward by moving the second arm 53 downward and places the support substrate S held on the Bernoulli chuck 51 to the second cleaning device. Thus, the support substrate S is placed on the second cleaning device as the bonding surface Sj faces upward. The bonding surface Sj is cleaned by the second cleaning device.

<2-4. Second Cleaning Device>

Figure 13A:
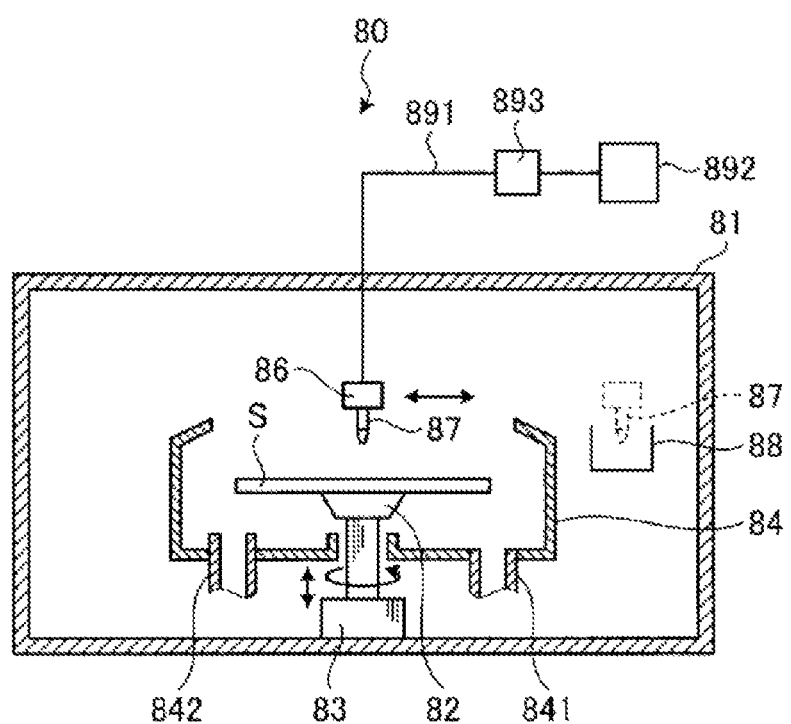
FIG. 13A is a schematic side view showing the configuration of a second cleaning device.
Figure 13B:
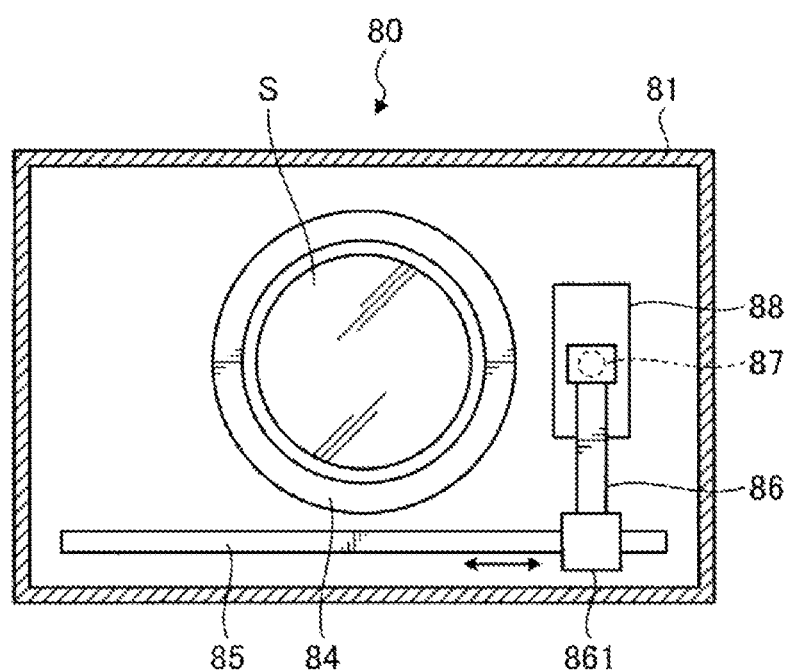
FIG. 13B is a schematic plan view showing the configuration of the second cleaning device.

Next, the configuration of the second cleaning device provided in the second cleaning station 22 will be described with reference to FIGS. 13A and 13B. FIG. 13A is a schematic side view showing the configuration of the second cleaning device. FIG. 13B is a schematic plan view showing the configuration of the second cleaning device.

As shown in FIG. 13A, the second cleaning device 80 includes a processing container 81. A carry-in/carry-out opening (not shown) for the support substrate S is formed in a side surface of the processing container 81. An opening/closing shutter (not shown) is provided in the carry-in/carry-out opening.

A spin chuck 82 holding and rotating the support substrate S is centrally disposed in the processing container 81. The spin chuck 82 has a horizontal top surface. Suction ports (not shown) sucking the support substrate S are formed in the top surface of the spin chuck 82. By the suction through the suction ports, the support substrate S is sucked and held on the spin chuck 82.

A chuck driving unit 83, which includes, for example, a motor, is disposed below the spin chuck 82. The chuck driving unit 83 rotates the spin chuck 82 at a predetermined speed. The chuck driving unit 83 is provided with an up-and-down drive source (e.g., a cylinder). The spin chuck 82 can be moved up and down by the up-and-down drive source.

A cup 84 receiving and recovering the liquid scattering or falling from the support substrate S is disposed around the spin chuck 82. A drain pipe 841 draining the recovered liquid and an exhaust pipe 842 vacuuming and evacuating the atmosphere within the cup 84 are connected to a bottom surface of the cup 84.

As shown in FIG. 13B, a rail 85 is provided in the processing container 81. A base end portion of an arm 86 is attached to the rail 85. A cleaning liquid nozzle 87 supplying a cleaning liquid (e.g., an organic solvent) to the support substrate S is supported on a tip end portion of the arm 86.

The arm 86 is movable along the rail 85 by a nozzle driving unit 861. Thus, the cleaning liquid nozzle 87 can be moved from a standby portion 88 provided beside the cup 84 to above a central portion of the support substrate S in the cup 84. Further, the cleaning liquid nozzle 87 can be moved above the support substrate S in a radial direction of the support substrate S. The arm 86 can be moved up and down by a nozzle driving unit 861, thereby adjusting a height of the cleaning liquid nozzle 87.

As shown in FIG. 13A, a supply pipe 891 supplying the cleaning liquid to the cleaning liquid nozzle 87 is connected to the cleaning liquid nozzle 87. The supply pipe 891 communicates with a cleaning liquid supply source 892 storing the cleaning liquid. A supply device 893 including a valve or a flow rate controller for controlling the flow of the cleaning liquid is provided at the supply pipe 891.

Under the control of the control device 60, the second cleaning device 80 performs a cleaning process (second cleaning process) for the support substrate S transferred by the third transfer device 50.

Specifically, the delaminated support substrate S is placed on the spin chuck 82 of the second cleaning device 80 by the third transfer device 50 as the bonding surface Sj faces upward. The second cleaning device 80 sucks and holds the support substrate S by means of the spin chuck 82 and then moves the spin chuck 82 downward to a predetermined position. Subsequently, the arm 86 moves the cleaning liquid nozzle 87, which stays in the standby portion 88, to above the central portion of the support substrate S. Thereafter, the cleaning liquid is supplied from the cleaning liquid nozzle 87 to the bonding surface Sj of the support substrate S while the support substrate S is rotated by the spin chuck 82. The supplied cleaning liquid is diffused to the entire bonding surface Sj of the support substrate S due to a centrifugal force. Consequently, the bonding surface Sj of the support substrate S is cleaned.

The cleaned support substrate S is carried out of the second cleaning device 80 by the second transfer device 40 and is accommodated to the cassette Cs of the carry-out station 24.

Lift pins (not shown), which support the support substrate S from below and moves the support substrate S up and down, may be provided below the spin chuck 82. In this case, the lift pins may be inserted to through-holes (not shown) formed in the spin chuck 82 and protrude from the top surface of the spin chuck 82. Further, the support substrate S may be delivered between the lift pins and the spin chuck 82 by moving the lift pins up and down instead of moving the spin chuck 82 up and down.

Further, in the second cleaning device 80, a back rinse nozzle (not shown), which injects the cleaning liquid toward a back surface of the support substrate S (i.e., the non-bonding surface Sn) (see FIG. 2), may be provided below the spin chuck 82. The cleaning liquid injected from the back rinse nozzle may clean the non-bonding surface Sn of the support substrate S and the outer periphery portion of the support substrate S.

As described above, the delamination system 1 according to the first embodiment includes the first processing block 10, which performs the processes for the DF-attached laminated substrate T or the delaminated target substrate W, and the second processing block 20, which performs the processes for the delaminated support substrate S.

The first processing block 10 includes the carry-in/carry-out station 11, the first transfer device 30, the delamination station 15 and the first cleaning station 16. The DF-attached laminated substrate T held by the dicing frame F or the delaminated target substrate W is placed in the carry-in/carry-out station 11. The first transfer device 30 transfers the delaminated target substrate W or the DF-attached laminated substrate T placed in the carry-in/carry-out station 11. The delamination device 5, which delaminates the DF-attached laminated substrate T transferred by the first transfer device 30 into the target substrate W and the support substrate S, is provided in the delamination station 15. The first cleaning device 70, which cleans the delaminated target substrate W, which is transferred by the first transfer device 30, while holding the delaminated target substrate W on the dicing frame F, is provided in the first cleaning station 16.

The second processing block 20 includes the second cleaning station 22, the delivery station 21, the second transfer device 40 and the carry-out station 24. The second cleaning device 80 that cleans the delaminated support substrate S is provided in the second cleaning station 22. The delivery station 21 is disposed between the second cleaning station 22 and the delamination station 15. The delivery station 21 receives the delaminated support substrate S from the delamination station 15 and delivers the delaminated support substrate S to the second cleaning station 22. The second transfer device 40 transfers the support substrate S cleaned by the second cleaning device 80. The support substrate S transferred by the second transfer device 40 is placed in the carry-out station 24.

In the delamination system 1, the first processing block 10 and the second processing block 20 are connected to each other by the delivery station 21. Thus, the delamination system 1 of the first embodiment can improve the throughput of the serial substrate processing processes including the delamination process and the cleaning process.

Further, the delamination device 5 according to the first embodiment includes the first holding unit 110, the second holding unit 150 and the movement mechanism 140. The first holding unit 110 holds the support substrate S of the DF-attached laminated substrate T from above. The second holding unit 150 holds the target substrate W of the DF-attached laminated substrate T from below via the dicing tape P. The movement mechanism 140 moves the first holding unit 110 away from the second holding unit 150. Thus, the delamination device 5 does not need to turn upside down the delaminated target substrate W and the efficiency of the delamination process can be enhanced.

Further, the delamination device 5 according to the first embodiment includes the first holding unit 110, the second holding unit 150 and the local movement unit 130. The first holding unit 110 holds the support substrate S of the DF-attached laminated substrate T in which the support substrate S and the target substrate W are bonded together. The second holding unit 150 holds the target substrate W of the DF-attached laminated substrate T. The local movement unit 130 moves a portion of the outer periphery portion of the first holding unit 110 away from the second holding unit 150. The first holding unit 110 is made of a pliable member. Thus, the delamination device 5 can efficiently perform the delamination of the support substrate S and the target substrate W.

Second Embodiment

To promote the delamination of the DF-attached laminated substrate T, a cut may be made in the side surface of the DF-attached laminated substrate T by means of a sharp member such as an edged tool or the like in the above-described delamination device. According to the second embodiment, a cut is made in the side surface of the DF-attached laminated substrate T by means of a sharp member. The description of the second embodiment will be described in detail below.

Figure 14:
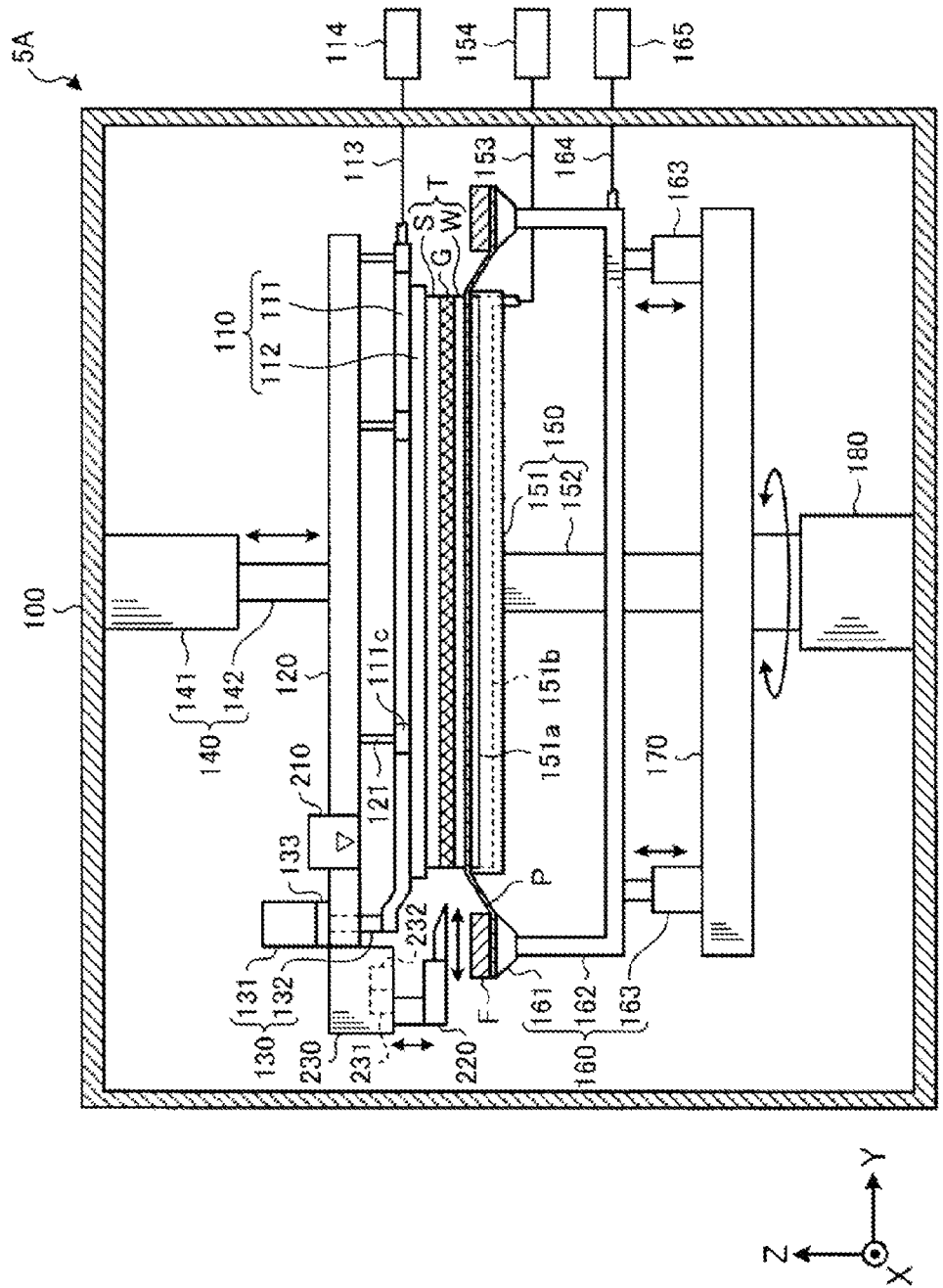
FIG. 14 is a schematic side view showing the configuration of a delamination device according to a second embodiment.

FIG. 14 is a schematic side view showing the configuration of a delamination device according to a second embodiment. In the following description, components identical to the already described components are designated by the same reference numeral and repetitive descriptions thereon are omitted.

As shown in FIG. 14, the delamination device 5A according to the second embodiment includes a measuring unit 210, a cut making unit 220 and a position adjustment unit 230 in addition to the components of the delamination device 5 according to the first embodiment. The measuring unit 210 and the position adjustment unit 230 are provided in, for example, the upper base unit 120. The cut making unit 220 is supported by the position adjustment unit 230 beside the DF-attached laminated substrate T.

For example, the measuring unit 210 is a laser displacement meter. The measuring unit 210 measures a distance from a predetermined measurement reference position to a holding surface of the second holding unit 150 or a distance from the measurement reference position to an object located between the measurement reference position and the holding surface of the second holding unit 150. The measurement result obtained by the measuring unit 210 is sent to the control device 60 (see FIG. 1).

Figure 15:
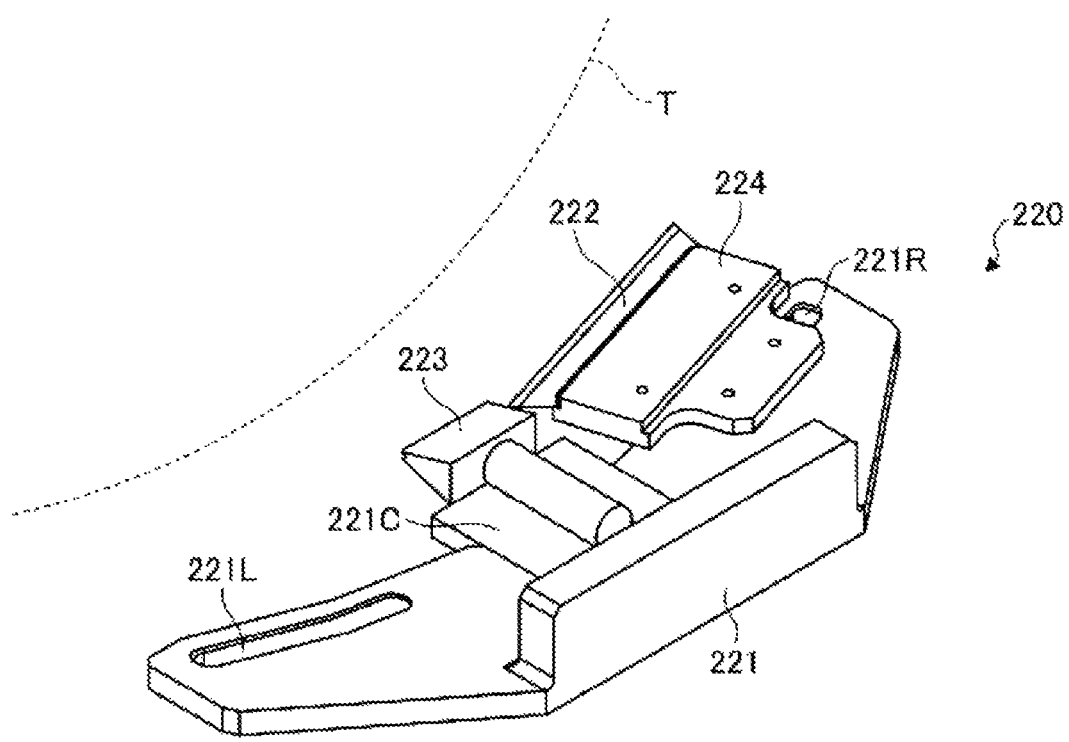
FIG. 15 is a schematic perspective view showing the configuration of a cut making unit.

The cut making unit 220 makes a cut in the bonding portion between the target substrate W and the support substrate S, i.e., the portion of the bonding agent G. The configuration of the cut making unit 220 will be described with reference to FIG. 15. FIG. 15 is a schematic perspective view showing the configuration of the cut making unit 220.

As shown in FIG. 15, the cut making unit 220 includes a body portion 221, a sharp member 222 and a gas ejection portion 223.

The body portion 221 is formed in an arcuate shape to conform a peripheral side of a substrate such as the laminated substrate T. The sharp member 222 is attached to a right section 221R of the body portion 221 via a fixing portion 224. The gas ejection portion 223 is attached to a central section 221C of the body portion 221.

The sharp member 222 is, for example, an edged tool, and is supported by the position adjustment unit 230 such that its tip end protrudes toward the DF-attached laminated substrate T. The sharp member 222 penetrates to the bonding agent G (the bonding portion of the target substrate W and the support substrate S) and makes the cut in the bonding agent G, thus creating a delamination start point.

In the second embodiment, the sharp member 222 is a single-edged tool in which a slant surface defining an edge angle is provided at a top surface, that is, toward the support substrate S. As such, the slant surface of the sharp member 222 faces toward the support substrate S and a flat surface of the sharp member 222 faces toward the target substrate W, thus preventing damages of the target substrate W (a product as a substrate) when the sharp member 222 penetrates to the bonding agent G.

For example, a razor blade, a roller blade or an ultrasonic cutter may be used as said edged tool. Further, if a ceramic resin-based edged tool or a fluorine-coated edged tool is used, particles may be prevented from being generated when making a cut in the DF-attached laminated substrate T. The fixing portion 224 is detachably attached to the right section 221R of the body portion 221. In the cut making unit 220, the sharp member 222 can be easily replaced by replacing the fixing portion 224.

In this embodiment, although it is illustrated that the sharp member 222 is attached to only the right section 221R of the body portion 221, the cut making unit 220 may include another sharp member 222 attached to a left section 221L of the body portion 221. Further, the cut making unit 220 may include different types of sharp members 222 at the right section 221R and the left section 221L.

The gas ejection portion 223 ejects a gas such as air or an inert gas toward a cut place of the bonding portion cut by the sharp member 222. That is, the gas ejection portion 223 injects the gas from the cut place made by the sharp member 222 to the inside of the DF-attached laminated substrate T, thus promoting the delamination of the DF-attached laminated substrate T.

The position adjustment unit 230 will be described with reference to FIG. 14. The position adjustment unit 230 includes a drive device 231 and a load cell 232. The drive device 231 moves the cut making unit 220 in the vertical direction or in the horizontal direction. By moving the cut making unit 220 in the vertical direction by the drive device 231, the position adjustment unit 230 adjusts the cut position of the cut making unit 220 for the bonding agent G. By moving the cut making unit 220 in the horizontal direction by the drive device 231, the position adjustment unit 230 allows the tip end of the sharp member 222 to penetrate to the bonding agent G. The load cell 232 detects a load applied to the cut making unit 220.

The penetration of the sharp member 222 to the bonding agent G is controlled using the drive device 231 and the load cell 232. This will be described below.

Further, in the control device 60 (see FIG. 1) according to the second embodiment, the storage unit (not shown) stores an information on a thickness of the DF-attached laminated substrate T, which is obtained in advance by an external device (hereinafter referred to as "prior thickness information"). The prior thickness information includes the thickness of the DF-attached laminated substrate T, a thickness of the target substrate W, a thickness of the support substrate S, a thickness of the bonding agent G and a thickness of the dicing tape P.

Based on the measurement result acquired from the measuring unit 210 as well as the prior thickness information stored in the storage unit, the control device 60 determines the cut position of the cut making unit 220 such that it falls within a thickness range of the bonding agent G. Then, the control device 60 controls the position adjustment unit 230 to move the cut making unit 220 such that the tip end of the sharp member 222 can be positioned in the decided cut position. The details of the position adjustment process will be described below.

As shown in FIG. 14, the frame holding unit 160 holds the dicing frame F in a position lower than the second holding unit 150. Thus, a space, through which the cut making unit 220 can move toward the DF-attached laminated substrate T held by the second holding unit 150, can be secured.

Figure 16:
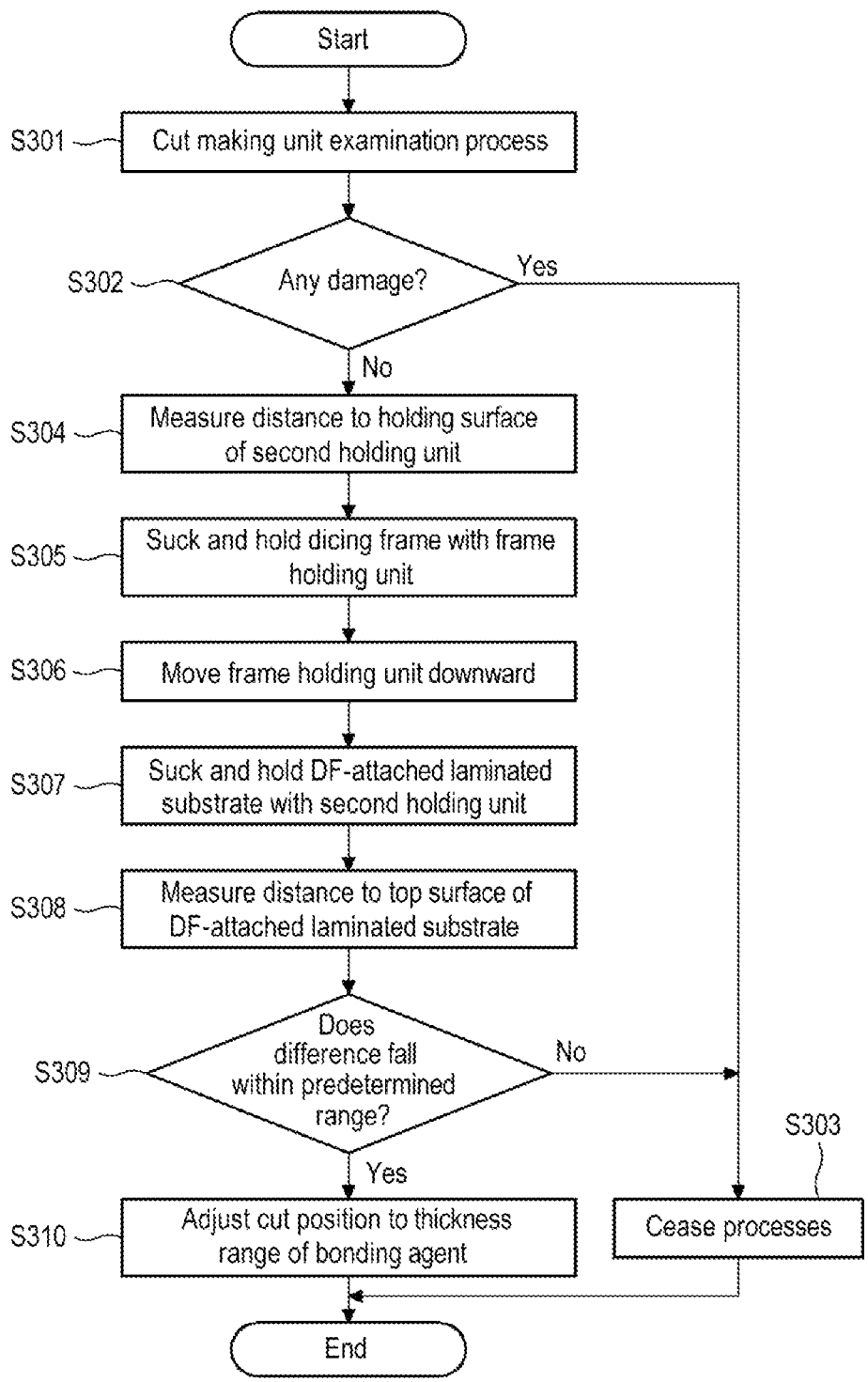
FIG. 16 is a flowchart showing process procedures of a position adjustment process for the cut making unit.
Figure 17B:
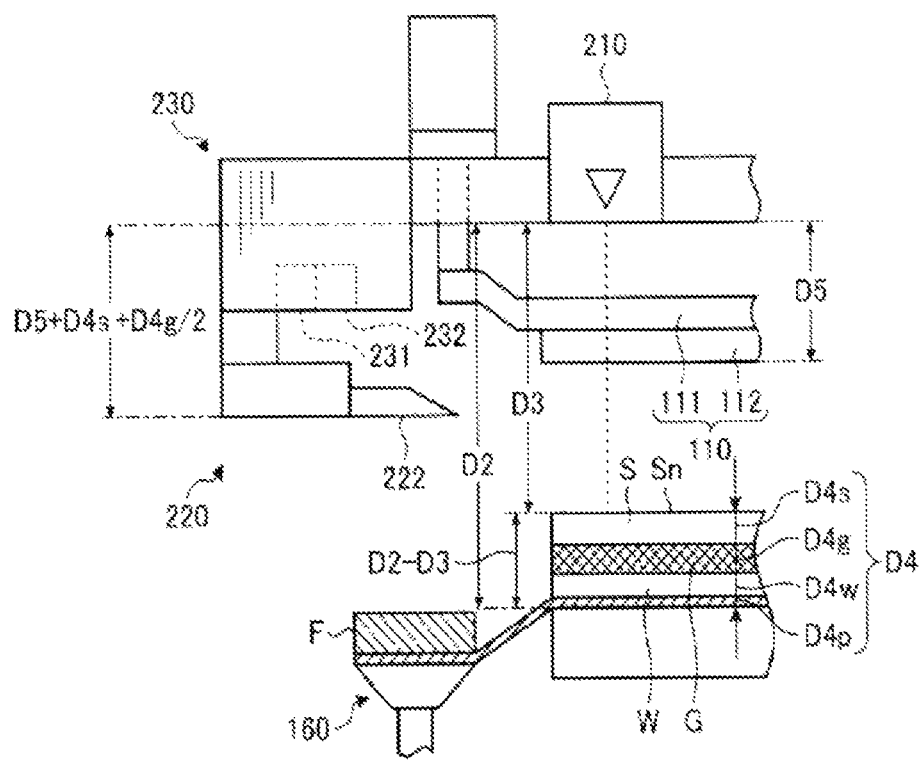
FIG. 17B is another view illustrating the operation of the delamination device.

The position adjustment process for the cut making unit 220 performed by the delamination device 5A according to the second embodiment will be described with reference to FIGS. 16, 17A and 17B. FIG. 16 is a flowchart showing the process procedures of the position adjustment process for the cut making unit 220. FIGS. 17A and 17B illustrate the operation of the delamination device 5A. Under the control of the control device 60, the delamination device 5A performs each process procedure shown in FIG. 16.

As shown in FIG. 16, the delamination device 5A first performs a cut making unit examination process (process S301). In the cut making unit examination process, it is examined by means of the measuring unit 210 whether the sharp member 222 is damaged (e.g., edge damage).

Specifically, as shown in FIG. 17A, the delamination device 5A measures the distance D1 from the measurement reference position to the top surface of the sharp member 222 by the measuring unit 210 while moving the cut making unit 220 in the horizontal direction by the position adjustment unit 230. The measurement result is sent to the control device 60. The control device 60 determines that the sharp member 222 is damaged, when a rate of change of the distance D1 exceeds a predetermined range or when the difference between a reference distance previously measured by using a new sharp member 222 and the distance D1 exceeds a predetermined range.

If it is determined in the cut making unit examination process of process S301 that the sharp member 222 is damaged (if YES in process S302), the delamination device 5A ceases subsequent processes (process S303). As such, the delamination device 5A detects the damage of the sharp member 222 based on the change in the distance D1 from the measurement reference position to the cut making unit 220 when the cut making unit 220 is moved in the horizontal direction. Thus, the damages of the target substrate W, which may occur when the cut is made in the DF-attached laminated substrate T by the damaged sharp member 222, can be prevented in advance.

If the damage of the sharp member 222 is not detected in the cut making unit examination process of process S301 (if NO in process S302), the delamination device 5A measures a distance D2 (see FIG. 17B) from the measurement reference position to the holding surface of the second holding unit 150 by the measuring unit 210 (process S304). At this time, the DF-attached laminated substrate T is not yet carried into the delamination device 5A.

The thickness D4 of the DF-attached laminated substrate T, the thickness D4w of the target substrate W, the thickness D4g of the bonding agent G, the thickness D4s of the support substrate S and the thickness D4p of the dicing tape P, which are shown in FIG. 17B, are stored in the storage unit of the control device 60 as the prior thickness information.

Subsequently, the delamination device 5A sucks and holds the dicing frame F of the DF-attached laminated substrate T, which is carried into the delamination station 15 by the first transfer device 30, from below by means of the frame holding unit 160 (process S305). Further, the delamination device 5A moves the frame holding unit 160 downward by means of the movement mechanism 163 (see FIG. 6) (process S306). Thus, the target substrate W of the DF-attached laminated substrate T contacts the second holding unit 150 via the dicing tape P. Thereafter, the delamination device 5A sucks and holds the DF-attached laminated substrate T by means of the second holding unit 150 (process S307). Thus, the DF-attached laminated substrate T is positioned such that the target substrate W is held by the second holding unit 150 and the dicing frame F is held by the frame holding unit 160.

Thereafter, the delamination device 5A measures a distance D3 (see FIG. 17B) from the measurement reference position to the top surface of the DF-attached laminated substrate T sucked and held by the second holding unit 150 (i.e., the non-bonding surface Sn of the support substrate S) (process S308). The measurement result is sent to the control device 60. The control device 60 determines whether the difference between the thickness (D2−D3) of the DF-attached laminated substrate T calculated from the measurement result of the measuring unit 210 and the thickness D4 of the DF-attached laminated substrate T included in the prior thickness information falls within a predetermined range.

In this regard, the difference between the thickness (D2−D3) of the DF-attached laminated substrate T calculated from the measurement result of the measuring unit 210 and the prior thickness information (D4) may exceed the predetermined range. This show that the DF-attached laminated substrate T other than the DF-attached laminated substrate T, which must be correctly carried in, is erroneously carried in. In this case, the thickness range of the bonding agent G, which is calculated based on the prior thickness information, may deviate from the actual thickness range. In addition, the tip end of the sharp member 222 may come into contact with the target substrate W or the support substrate S, thereby damaging the target substrate W or the support substrate S. For the reasons noted above, if the difference between the thickness of the DF-attached laminated substrate T calculated by using the measurement result of the measuring unit 210 and the thickness of the DF-attached laminated substrate T included in the prior thickness information exceeds the predetermined range (if NO at process S309), then the delamination device 5A ceases subsequent processes (process S303).

However, if the aforesaid difference falls within the predetermined range (if YES at process S309), then the control device 60 calculates the thickness range of the bonding agent G (the bonding portion of the target substrate W and the support substrate S) based on the prior thickness information.

By way of example, as shown in FIG. 17B, a distance from the measurement reference position of the measuring unit 210 to the holding surface of the first holding unit 110 (i.e., the bottom surface of the suction pad 112) is assumed as D5. Then, the thickness range of the bonding agent G when the DF-attached laminated substrate T is sucked and held by the first holding unit 110 is from D5+D4s to D5+D4s+D4g. The control device 60 determines the cut position of the cut making unit 220 within this thickness range. For example, the control device 60 determines the median of the thickness range (e.g., D5+D4s+D4g/2) as the cut position. In this connection, it is assumed that the distance D5 from the measurement reference position to the bottom surface of the suction pad 112 is previously stored in the storage unit of the control device 60.

If the cut position of the cut making unit 220 is determined by the control device 60, then the delamination device 5A moves the cut making unit 220 by means of the position adjustment unit 230 under the control of the control device 60, thus adjusting the cut position of the cut making unit 220 within the thickness range of the bonding agent G (process S310). That is, the delamination device 5A moves the cut making unit 220 in the vertical direction by means of the position adjustment unit 230 such that the tip end of the sharp member 222 is positioned in the cut position decided by the control device 60.

Thereafter, the delamination device 5A performs the process S204 and the processes subsequent thereto, which are shown in FIG. 9. When the delamination device 5A pulls a portion of the outer periphery portion of the first holding unit 110 by means of the local movement unit 130 at process S206, the delamination device 5A horizontally moves the cut making unit 220 by means of the position adjustment unit 230, thereby allowing the sharp member 222 to penetrate to the bonding agent G. Thus, the cut is made in the bonding agent G (the bonding portion of the target substrate W and the support substrate S) and the delamination of the DF-attached laminated substrate T performed by the local movement unit 130 is promoted.

The penetration depth of the sharp member 222 to the bonding agent G may be, for example, about 2 mm. Further, the timing of the penetration of the sharp member 222 to the bonding agent G may be between the processes S205 and S206 or between the processes S206 and S207 or may coincide with the process S206.

As described above, the penetration of the sharp member 222 to the bonding agent G is controlled using the drive device 231 and the load cell 232. Specifically, the sharp member 222 penetrates to the bonding agent G at a predetermined speed by the drive device 231. The cut start position (the position where the tip end of the sharp member 222 contacts the bonding agent G) is detected by the load cell 232. The drive device 231 allows the sharp member 222 to penetrate to the bonding agent G by a preprogrammed amount from such a cut start position.

As such, the delamination device 5A according to the second embodiment performs the penetration of the cut making unit 220 to the bonding agent G, thereby creating a delamination start point in the DF-attached laminated substrate T.

Further, the delamination device 5A according to the second embodiment is configured to adjust the position of the cut making unit 220 based on the measurement result of the measuring unit 210 and the prior thickness information. Thus, the tip end of the sharp member 222 can reliably penetrate to the bonding agent G.

Since the target substrate W, the support substrate S and the bonding agent G are very thin, it is difficult to align the position of the cut making unit 220 with naked eyes. In contrast, by using the measuring unit 210, the position of the bonding agent G can be easily and accurately detected and thus the cut position of the cut making unit 220 can be aligned. Further, it may be considered that the cut position is identified through image recognition using a camera or the like. However, it is difficult to identify the position of the bonding agent G using the image recognition because of the following reasons: focusing is difficult because of the peripheral side of a substrate such as the laminated substrate T; light reflects on the substrate; and the bonding agent G is transparent. In contrast, by using the measuring unit 210, the position of the bonding agent G can be readily identified without the aforementioned problems.

Further, the cut making unit 220 makes the cut in the bonding agent G when the difference between the previously-obtained thickness of the DF-attached laminated substrate T and the calculated thickness of the DF-attached laminated substrate T, which is calculated using the distance D2 from the measurement reference position to the holding surface of the second holding unit 150 and the distance D3 from the measurement reference position to the DF-attached laminated substrate T held by the first holding unit 110, falls within a predetermined range. Thus, the damage of the target substrate W and the support substrate S, which is caused by the sharp member 222, can be prevented in advance.

In this embodiment, although it is illustrated that the sharp member 222 is a single-edged tool, the sharp member 222 may be a double-edged tool. The sharp member 222 does not need to be an edged tool. The sharp member 222 may be a tubular needle, such as a hypodermic needle or the like, or a wire.

Further, the delamination device 5A according to the second embodiment may detect an inclination of the second holding unit 150 using the measuring unit 210. Specifically, the delamination device 5A measures the distance D2 (see FIG. 17B) from the measurement reference position to the holding surface of the second holding unit 150 while rotating the second holding unit 150 by the rotation mechanism 180. If the amount of change of the distance D2 is equal to or greater than a predetermined amount, e.g., 20 µm, then the delamination device 5A determines that the holding surface of the second holding unit 150 is inclined, and then ceases the subsequent processes.

As such, the delamination device 5A can detect the inclination of the holding surface of the second holding unit 150 based on the change in the distance D2 from the measurement reference position to the holding surface of the second holding unit 150 when the second holding unit 150 is rotated.

If the holding surface of the second holding unit 150 is inclined, differences may occur between the thickness range of the bonding agent G calculated by using the prior thickness information and the actual thickness range of the bonding agent G. For this reason, the sharp member 222 cannot appropriately penetrate to the bonding agent G. Therefore, by ceasing the subsequent processes when the holding surface of the second holding unit 150 is inclined, the damage of the target substrate W and the support substrate S, which is caused by the sharp member 222, can be prevented in advance. Alternatively, the process of detecting the inclination of the second holding unit 150 may be performed before the DF-attached laminated substrate T is carried into the delamination device 5A.

Third Embodiment

Figure 18A:
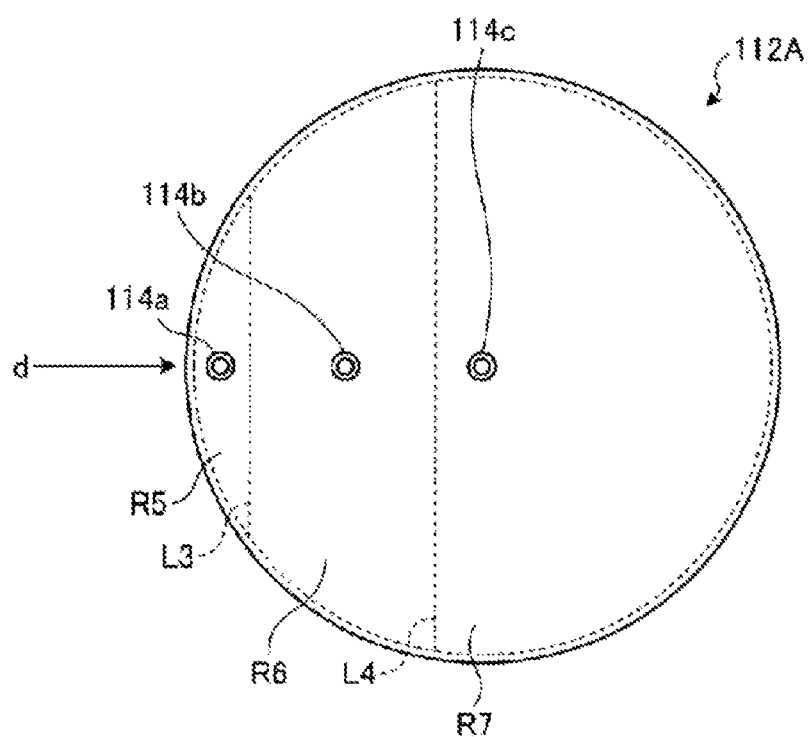
FIG. 18A is a schematic top view showing another configuration of the suction pad.
Figure 18B:
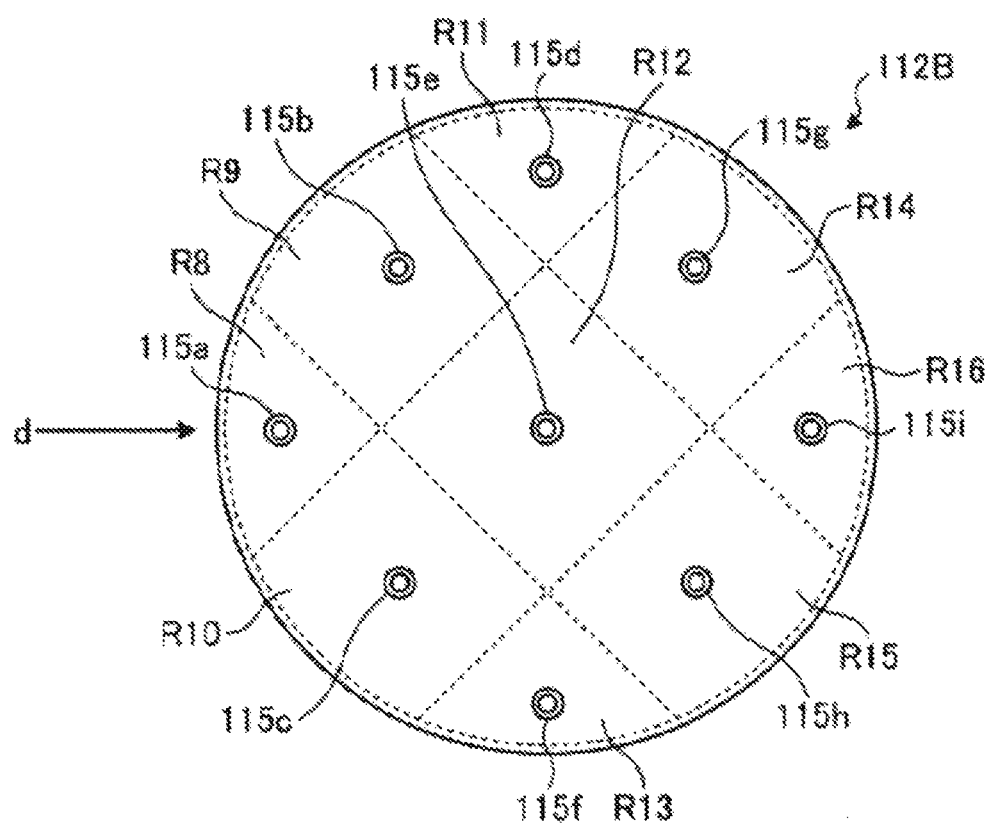
FIG. 18B is a schematic top view showing a yet another configuration of the suction pad.

In the above-described delamination device, the first holding unit includes the suction pad 112 (see FIG. 7B) whose suction region is divided by a plurality of lines extending radially from the center and a plurality of circular arcs. However, the configuration of the suction pad of the first holding unit is not limited thereto. Another configuration examples of the suction pad of the first holding unit will be described below with reference to FIGS. 18A to 18C. FIGS. 18A to 18C are schematic top views showing another configuration examples of the suction pad.

As shown in FIG. 18A, the suction region of the suction pad 112A may be divided by lines perpendicular to the delamination progress direction d. In the example shown in FIG. 18A, the suction region of the suction pad 112A is divided into individual regions R5 to R7 by two straight lines L3 and L4 perpendicular to the delamination progress direction d.

As such, the suction region of the suction pad may be divided by the lines perpendicular to the delamination progress direction. The suction pad having this configuration is suitable for the case where the delamination is done in one direction.

Similar to the suction pad 112 shown in FIG. 7B, suction ports 114a to 114c are formed in the respective individual regions R5 to R7 of the suction pad 112A. Each of the suction ports 114a to 114c is connected to the suction device via suction pipes. Thus, similar to the suction pad 112 shown in FIG. 7B, the support substrate S can be appropriately held.

Further, similar to the suction pad 112 shown in FIG. 7B, the individual regions R5 to R7 are formed such that the individual region R7 defined at the front side of the delamination progress direction d is larger than the individual region R5 defined at the rear side of the delamination progress direction d. Thus, similar to the suction pad 112 shown in FIG. 7B, the support substrate S can be prevented from being delaminated from the first holding unit 110 during the delamination operation.

In this example, the suction region of the suction pad 112A is divided into three individual regions R5 to R7 but the division number of the suction region is not limited to three.

Further, as shown in FIG. 18B, the suction region of the suction pad 112B may be divided in a lattice shape. FIG. 18B shows an example where the suction region of the suction pad 112B is divided into nine individual regions R8 to R16. Similar to the suction pad 112 shown in FIG. 7B, suction ports 115a to 115i are formed in the respective individual regions R8 to R16 and are connected to the suction device via suction pipes.

As such, the suction region of the suction pad may be divided in a lattice shape. In this example, the straight lines dividing the suction region of the suction pad 112B are inclined with respect to the delamination progress direction d. Alternatively, the suction pad may be divided in a lattice shape by straight lines parallel to the delamination progress direction d and straight lines perpendicular to the delamination progress direction d.

The foregoing embodiments are described with the example where the delamination progress direction is one direction. However, the delamination operation may be performed in multiple directions by providing a plurality of the local movement units 130.

In this case, as shown in FIG. 18C, the suction region of the suction pad may be divided into a plurality of sector regions corresponding to the delamination progress directions d1 to d3 by a plurality of lines extending radially from the center. The sector region in each delamination progress direction may be further divided into a plurality of individual regions by circular arcs. For example, the suction region of the suction pad 112C shown in FIG. 18C is divided into three sector regions that correspond to the delamination progress directions d1 to d3 respectively. Further, each of the sector regions is divided into three individual regions by circular arcs.

Specifically, the sector region corresponding to the delamination progress direction d1 is divided into the individual regions R17 to R19. The sector region corresponding to the delamination progress direction d2 is divided into the individual regions R20 to R22. The sector region corresponding to the delamination progress direction d3 is divided into the individual regions R23 to R25. Suction ports 116a to 116c, 117a to 117c and 118a to 118c are formed in the respective individual regions R17 to R25 and are connected to the suction device via suction pipes. The suction ports 116a to 116c, 117a to 117c and 118a to 118c may be connected to a single suction device or may be connected to a plurality of suction devices that are provided in the respective delamination progress directions d1 to d3.

Further, an optimal cut making direction may be in the laminated substrate T depending upon a crystal direction, a warp direction or a pattern. Thus, in the second embodiment, the position of the sharp member 222 in a circumferential direction may be changed depending upon the type of the laminated substrate T. In this case, for example, after the dicing frame F is held by the frame holding unit 160 (see FIG. 14), the cut position of the sharp member 222 in the circumferential direction may be adjusted by rotating the rotation mechanism 180 to a predetermined position and thereafter the sharp member 222 may penetrate to the bonding agent G. Thus, since the sharp member 222 can be positioned in any position along the circumferential direction, the cut can be made in any types of the laminated substrate T in an optimal position of such a laminated substrate T. Further, after delaminating the laminated substrate T, the rotation mechanism 180 is rotated again and comes back to its initial rotation position.

Further, when the delamination is unfeasible in a first rotation position, the rotation mechanism 180 may be rotated to a second rotation position in order to attempt to perform the delamination. It may be determined whether the delamination is unfeasible, for example, by detecting the failure in sucking and holding of the first holding unit 110 and the second holding unit 150 or detecting the overload in a motor in case where the motor is used as the drive unit of the rotation mechanism 180. By providing the above-described reattempt function, the delamination process can be fulfilled without stop even if the delamination is unfeasible due to the partial deterioration of the bonding agent G or the failure of the first holding unit 110 or the second holding unit 150.

The foregoing embodiments are described with an example where the target substrate W and the support substrate S are bonded together by the bonding agent G. Each of the bonding surface Wj and the bonding surface Sj may be divided into a plurality of regions and bonding agents having different bonding force may be applied to the respective regions.

The delamination system according to the embodiments described herein can achieve the improvement in throughput.

While certain embodiments have been described, these embodiments have been presented by way of example only, and are not intended to limit the scope of the disclosures. Indeed, the novel systems described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A delamination system for delaminating a laminated substrate, in which a first substrate and a second substrate are bonded together, into the first substrate and the second substrate, the laminated substrate disposed in an opening of a frame, the opening having a diameter larger than the laminated substrate, the laminated substrate being held by the frame with a non-bonding surface of the first substrate attached to a tape provided in the opening, the delamination system comprising:

a first processing block configured to process at least one of the laminated substrate and the delaminated first substrate; and a second processing block configured to process the delaminated second substrate, wherein the first processing block comprises:

a carry-in/carry-out station in which the laminated substrate held by the frame or the delaminated first substrate is placed, and configured to receive or carry out the laminated substrate or the delaminated first substrate;

a first transfer device configured to transfer at least one of the delaminated first substrate and the laminated substrate placed in the carry-in/carry-out station;

a delamination station including a delamination device configured to delaminate the laminated substrate transferred by the first transfer device into the first substrate and the second substrate; and a first cleaning station including a first cleaning device configured to clean the delaminated first substrate transferred by the first transfer device in a state where the delaminated first substrate is held by the frame, and wherein the second processing block comprises:

a second cleaning station including a second cleaning device configured to clean the delaminated second substrate;

a delivery station disposed between the second cleaning station and the delamination station, and configured to receive the delaminated second substrate from the delamination station and to deliver the delaminated second substrate to the second cleaning station;

a second transfer device configured to transfer the second substrate cleaned by the second cleaning device; and a carry-out station in which the second substrate transferred by the second transfer device is placed, wherein the delivery station includes a third transfer device configured to hold the delaminated second substrate without making contact to the delaminated substrate and to transfer the delaminated second substrate, and the third transfer device is configured to turn upside down the second substrate held in a non-contact manner and then to deliver the second substrate to the second cleaning station.

2. The delamination system of claim 1, wherein the first substrate and the second substrate are bonded together by an bonding agent, and wherein the first processing block further comprises an edge cut station including an edge cut device configured to remove a peripheral edge of the bonding agent by dissolving the peripheral edge with a solvent.

3. The delamination system of claim 1, wherein the carry-in/carry-out station and the carry-out station are disposed at the same side, wherein the delamination station and the first cleaning station are disposed side by side opposite the carry-in/carry-out station with a first transfer region therebetween, the first transfer device being disposed in the first transfer region, and wherein the delivery station and the second cleaning station are disposed side by side opposite the carry-out station with a second transfer region therebetween, the second transfer device being disposed in the second transfer region.

4. The delamination system of claim 1, wherein the first processing block further comprises a standby station including a temporary standby unit configured to temporarily keep the laminated substrate in a standby state.

* * * * *